US012733553B2

(12) United States Patent
Cho et al.

(10) Patent No.: US 12,733,553 B2
(45) Date of Patent: Sep. 8, 2026

(54) LIGHT EMITTING DISPLAY DEVICE, AND CAR HAVING LIGHT EMITTING DISPLAY DEVICE

(71) Applicant: Samsung Display Co., Ltd., Yongin-Si (KR)

(72) Inventors: Hyun Min Cho, Yongin-si (KR); Jun Ho Sim, Yongin-si (KR); Jae Hun Lee, Yongin-si (KR); Yun Jong Yeo, Yongin-si (KR); Dawoon Jung, Yongin-si (KR); Yang-Ho Jung, Yongin-si (KR); Yu-Gwang Jeong, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 375 days.

(21) Appl. No.: 18/444,783

(22) Filed: Feb. 19, 2024

(65) Prior Publication Data

US 2024/0347507 A1 Oct. 17, 2024

(30) Foreign Application Priority Data

Apr. 11, 2023 (KR) ........................ 10-2023-0047538

(51) Int. Cl.

*H10W 90/00* (2026.01)
*B60K 35/22* (2024.01)
*H10D 86/40* (2025.01)
*H10D 86/60* (2025.01)
*H10H 20/855* (2025.01)

(52) U.S. Cl.

CPC ............. *H10W 90/00* (2026.01); *B60K 35/22* (2024.01); *H10D 86/441* (2025.01); *H10D 86/60* (2025.01); *H10H 20/855* (2025.01); *B60K 2360/332* (2024.01); *B60K 2360/343* (2024.01)

(58) Field of Classification Search

CPC ............... H10K 59/12; H10K 59/8791; H10K 59/8792; H10K 59/122; H10K 59/90

See application file for complete search history.

(56) References Cited

U.S. PATENT DOCUMENTS 9,829,614 B2 11/2017 Smith et al.
2010/0015424 A1* 1/2010 Seo ........................ H10K 71/00 427/541
2019/0165047 A1* 5/2019 Xiao ........................ G03C 7/06
2020/0266253 A1* 8/2020 Kim .................. H10K 59/8792

(Continued)

FOREIGN PATENT DOCUMENTS

JP 2007-248938 A 9/2007
KR 10-1045545 B1 6/2011
KR 10-2021-0092351 A 7/2021

*Primary Examiner* — Syed I Gheyas

(74) *Attorney, Agent, or Firm* — Innovation Counsel LLP

(57) ABSTRACT

A light emitting display device and a car including the same according to embodiments include: a substrate; a plurality of light emitting diodes that are disposed above the substrate and include a plurality of light emitting layers; a pixel defining layer that has openings corresponding to the plurality of light emitting layers; and a plurality of light blocking patterns that are disposed on the pixel defining layer and the plurality of light emitting layers, and extend in a first direction. Each of the plurality of light blocking patterns includes a first portion and a second portion formed on the first portion and having a width decreasing toward an upper portion thereof.

20 Claims, 19 Drawing Sheets

(56) References Cited

U.S. PATENT DOCUMENTS

| | | | | |
|---|---|---|---|---|
| 2021/0217831 | A1* | 7/2021 | Jung | H10K 59/873 |
| 2023/0099374 | A1* | 3/2023 | Hong | H10K 59/352<br>257/91 |

* cited by examiner

FIG. 6A
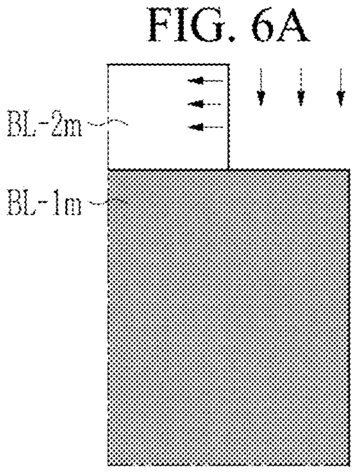
FIG. 6B
BL-2m
BL-1m
FIG. 6C
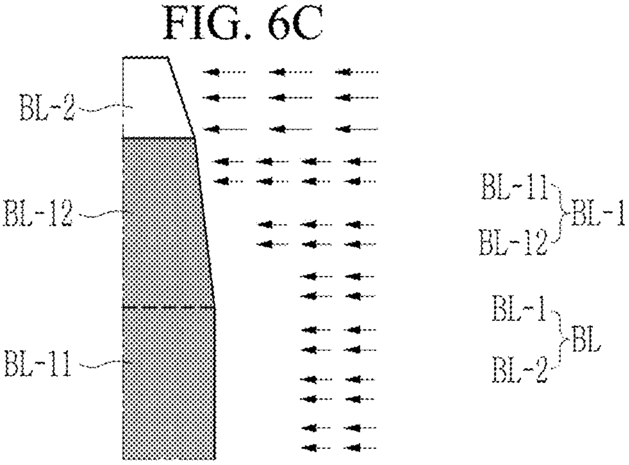

FIG. 14

| | | Trapezoid | Inverted trapezoid |
|---|---|---|---|
| Thickness | | 92㎛ | |
| Lower surface | Width (㎛) | 16㎛ | 6.2㎛ |
| | Interval (㎛) | 28.3㎛ | 39.8㎛ |
| | Ratio | 325% | 231% |
| Cut-Off | 35° | 2.7% | 7.3% |
| | 45° | 0.6% | 1.7% |
| Theoretical transmittance based on lower surface (Transmission window / BM + Transmission window ratio) | | 64% | 87% |
| Actual measurement transmittance | | 86% | 67% |

(A)

(B)

(A)

(B)

LIGHT EMITTING DISPLAY DEVICE, AND CAR HAVING LIGHT EMITTING DISPLAY DEVICE

CROSS-REFERENCE TO RELATED APPLICATION

This application claims priority to and the benefit of Korean Patent Application No. 10-2023-0047538 filed at the Korean Intellectual Property Office on Apr. 11, 2023, the entire contents of which are incorporated herein by reference.

BACKGROUND

1. Field

The present disclosure relates to a light emitting display device and a car having the light emitting display device, and more particularly, to a light emitting display device including a plurality of light blocking patterns at a front surface of a light emitting layer and a car having the light emitting display device.

2. Description of the Related Art

A display device is a device for displaying an image, and includes a liquid crystal display (LCD), an organic light emitting diode (OLED) display, and the like. The display device is used in various electronic devices such as mobile phones, navigation devices, digital cameras, electronic books, portable game machines, various terminals, and the like.

In addition, the display device may be used in various fields besides electronic devices, and, in the case of a car, a conventional analog instrument panel and a conventional analog center fascia are being replaced by a digital instrument panel and a digital center fascia.

SUMMARY

Embodiments secure a transmittance of a certain level or higher while blocking light emitted from a display device from being emitted in a specific direction.

The embodiments ensure that light emitted from the display device used in a car is provided to a driver's eyes not to interfere with the driving of the car.

The embodiments prevent the light emitted from the display device used in the car from being incident on the driver's eyes by avoiding the light emitted from the display device from being reflected on the windshield of the car at night.

A light emitting display device according to an embodiment includes: a substrate; a plurality of light emitting diodes that are disposed above the substrate and include a plurality of light emitting layers; a pixel defining layer that has openings corresponding to the plurality of light emitting layers; and a plurality of light blocking patterns that are disposed on the pixel defining layer and the plurality of light emitting layers, and extend in a first direction. Each of the plurality of light blocking patterns includes a first portion and a second portion formed on the first portion and having a width decreasing toward an upper portion thereof.

The first portion and the second portion may have different etching rates and the etching rate of the first portion may be lower than that of the second portion.

The first portion may further include: a third portion disposed on the second portion. The third portion may have a width decreasing toward an upper portion thereof.

A slope of a side surface of the third portion may be different from a slope of a side surface of the second portion.

The third portion may include a transparent organic material.

The third portion may include at least one of amorphous carbon, silicon oxide ($SiO_x$), silicon nitride ($SiN_x$), silicon oxynitride (SiON), indium zinc oxide (IZO), indium tin oxide (ITO), and indium gallium zinc oxide (IGZO).

A lower surface of the third portion and an upper surface of the second portion may have the same width, or the lower surface of the third portion may have a narrower width than that of the upper surface of the second portion.

The first portion and the second portion may have a width that decreases toward an upper portion of the second portion as a whole.

The first portion and the second portion may include a light blocking material, and the light blocking material may include at least one of an organic material including a black color pigment, carbon black, carbon nanotube, a resin or a paste including a black dye, a metal particle, a metal alloy, and a metal oxide.

The light emitting display device may further include an upper transparent organic film disposed between the plurality of light blocking patterns disposed adjacent to each other.

At least one of the plurality of light blocking patterns may cross and overlap at least one of the plurality of light emitting layers.

Each of the plurality of light emitting diodes may have a viewing angle so that light emitted from the each of the plurality of light emitting diodes is not emitted at an angle greater than or equal to the viewing angle with respect to a normal line, and the viewing angle may be greater than or equal to 30 degrees and less than or equal to 45 degrees.

A car according to an embodiment includes a first light emitting display device that includes a first substrate, a plurality of first light emitting diodes that are disposed above the first substrate and include a plurality of first light emitting layers, a first pixel defining layer that has first openings corresponding to the plurality of first light emitting layers, and a plurality of first light blocking patterns that are disposed on the first pixel defining layer and the plurality of first light emitting layers, and extend in a first direction. Each of the plurality of first light blocking patterns includes a first portion and a second portion formed on the first portion and having a width decreasing toward an upper portion thereof.

The car may further include a second light emitting display device that includes a second substrate, a plurality of second light emitting diodes that are disposed above the second substrate and include a plurality of second light emitting layers, a second pixel defining layer that has second openings corresponding to the plurality of second light emitting layers, and a plurality of second light blocking patterns that are disposed on the second pixel defining layer and the plurality of second light emitting layers, and extend in a second direction different from the first direction. Each of the plurality of second light blocking patterns may include a first portion and a second portion formed on the first portion and having a width decreasing toward an upper portion thereof.

The first portion and the second portion of the plurality of second light blocking patterns may have different etching rates, and the etching rate of the first portion may be lower than that of the second portion.

The first portion and the second portion of the plurality of first light blocking patterns may have different etching rates, and the etching rate of the first portion may be lower than that of the second portion.

The first portion may have a pillar shape with a certain width; and the second portion may have a width decreasing toward an upper portion thereof.

The first portion and the second portion may have a width that decreases toward an upper portion of the second portion as a whole.

The car may further include an upper transparent organic film disposed between the plurality of first light blocking patterns disposed adjacent to each other.

At least one of the plurality of first light blocking patterns may cross and overlap the light emitting layer.

According to the embodiments, a plurality of light blocking patterns are formed at a front surface of a light emitting layer in one direction so that light provided from the light emitting layer is not emitted in a specific direction, and each light blocking pattern includes a portion having a trapezoid shape in cross-sectional view so that transmittance is further improved.

Light emitted from a display device used in a car is not provided to the windshield of the car, so that light is not reflected from the windshield of the car at night so as not to interfere with a driver's view.

Light emitted from a display device disposed at a passenger seat is not provided to the driver so that the light does not interfere with driving of the car.

When the present embodiment is compared with a comparative example in which a light blocking pattern is formed in the form of a film at a front surface of a light emitting layer, the present embodiment may directly form the light blocking pattern within a light emitting display device so that there is no misalignment problem, a moire phenomenon is removed, the present embodiment has a thin thickness, the present embodiment reduces manufacturing cost, and the present embodiment has high transmittance.

BRIEF DESCRIPTION OF THE DRAWINGS

FIGS. 6A, 6B and 6C are views sequentially showing a manufacturing method for forming a light blocking pattern of the light emitting display device according to an embodiment.

FIGS. 12, 13 and 14 are views for comparing and explaining characteristics of a cross-sectional shape of the light blocking pattern.

DETAILED DESCRIPTION

Figure 1:
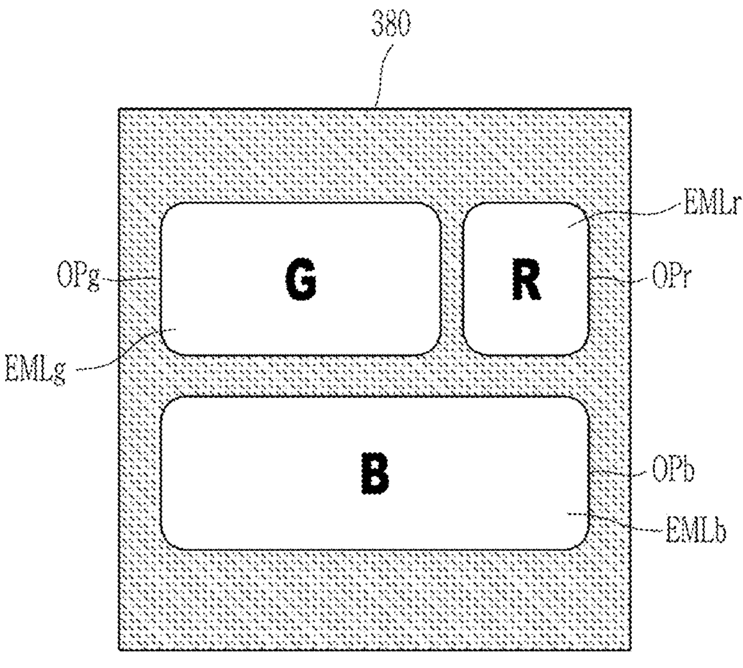
FIG. 1 is a plan view schematically illustrating a pixel of a light emitting display device according to an embodiment.

The present disclosure will be described more fully hereinafter with reference to the accompanying drawings, in which embodiments of the disclosure are shown. As those skilled in the art would realize, the described embodiments may be modified in various ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It should be understood that when an element such as a layer, film, region, area, substrate, plate, or constituent element is referred to as being "on" or "above" another element, it may be directly on the other element, or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" should be understood to imply the inclusion of stated elements but not the exclusion of any other elements.

Further, throughout the specification, the phrase "in a plan view" or "in a plan view" means viewing a target portion from the top, and the phrase "in a cross-sectional view" or "on a cross-section" means viewing a cross-section formed by vertically cutting a target portion from the side.

In addition, throughout the specification, "connected" does not only mean when two or more elements are directly connected, but when two or more elements are indirectly connected through other elements, and when they are physically connected or electrically connected, and further, it may be referred to by different names depending on a position or function, and may also be referred to as a case in which respective parts that are substantially integrated are linked to each other.

In addition, throughout the specification, when it is said that an element such as a wire, layer, film, region, area, substrate, plate, or constituent element "is extended (or extends) in a first direction or second direction," this does not mean only a straight shape extending straight in the corresponding direction, but may mean a structure that substantially extends in the first direction or the second direction, is partially bent, has a zigzag structure, or extends while having a curved structure.

In addition, an electronic device (for example, a mobile phone, a TV, a monitor, or a laptop computer) included in a display device, a display panel, or the like described in the specification, or an electronic device included in a display device, a display panel, or the like manufactured by a manufacturing method described in the specification is not excluded from the scope of the present specification.

Hereinafter, a light blocking pattern formed in a light emitting display device according to an embodiment will be described through FIGS. 1 to 4.

Figure 2:
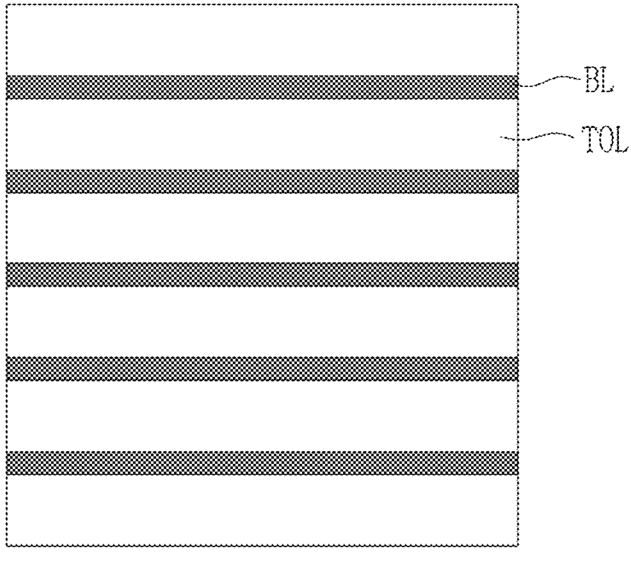
FIG. 2 is a plan view schematically illustrating a plurality of light blocking patterns and an upper transparent organic film formed in the light emitting display device according to an embodiment.
Figure 3:
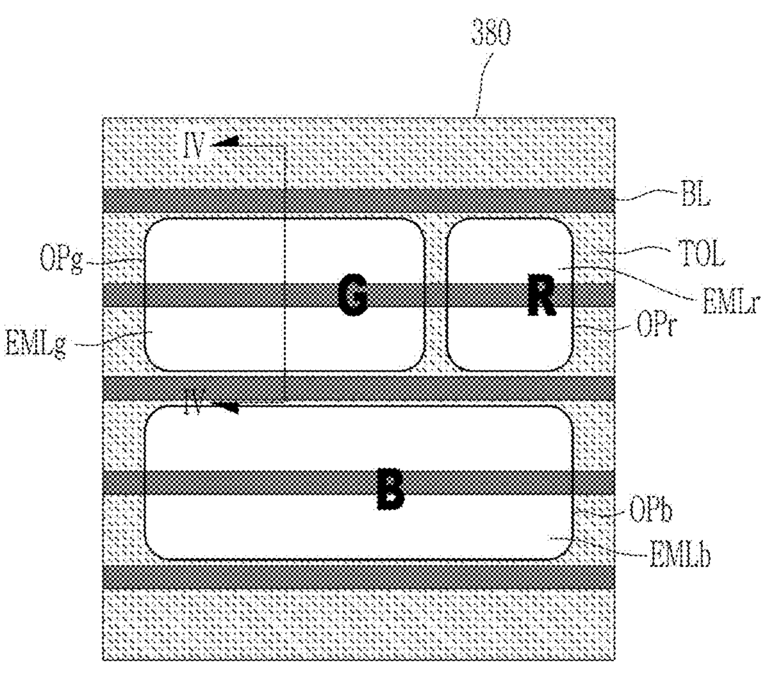
FIG. 3 is a plan view schematically illustrating a light emitting display device combining FIGS. 1 and 2.

FIG. 1 is a plan view schematically illustrating a pixel of the light emitting display device according to an embodiment, FIG. 2 is a plan view schematically illustrating a plurality of light blocking patterns and an upper transparent organic film formed in the light emitting display device according to an embodiment, FIG. 3 is a plan view schematically illustrating a light emitting display device combining FIGS. 1 and 2, and FIGS. 4A and 4B are cross-sectional views cut along a line IV-IV of FIG. 3.

In FIG. 1, three light emitting diodes disposed adjacent to each other and representing different colors R, G, and B, are briefly illustrated, and each light emitting diode includes a light emitting layer (or an emission layer) EMLr, EMLg, or EMLb.

Each light emitting layer EMLr, EMLg, or EMLb is a portion of the light emitting diode that emits light, and the light emitting layers EMLr, EMLg, and EMLb are partitioned (or divided) by a pixel defining film 380. Each light emitting layer EMLr, EMLg, or EMLb may have an exposed portion in an area corresponding to an opening OPr, OPg, or OPb disposed in the pixel defining film 380, and at least some of the light emitting layers EMLr, EMLg, and EMLb may have a structure in which the at least some of the light emitting layers are exposed upward without overlapping the pixel defining film 380. According to an embodiment, each light emitting layer EMLr, EMLg, or EMLb may be disposed only within each opening OPr, OPg, or OPb of the pixel defining film 380. Although not shown in FIG. 1, a cathode and an encapsulation layer may be sequentially disposed on the pixel defining film 380 and the light emitting layer EMLr, EMLg, or EMLb, and an anode may be disposed below each light emitting layer EMLr, EMLg, or EMLb. Here, one anode, one light emitting layer EMLr, EMLg, or EMLb, and one cathode may constitute one light emitting diode. A detailed stacked structure of the light emitting diode will be described with reference to FIGS. 18 and 19.

FIG. 2 shows the plurality of light blocking patterns (hereinafter also referred to as light blocking linear patterns) BL disposed on an upper portion of the light emitting diode and a planar structure of the upper transparent organic film TOL disposed around the plurality of light blocking patterns.

The light blocking pattern BL extends in one direction, and an interval between adjacent light blocking patterns BL is constant. According to an embodiment, the interval between the light blocking patterns BL may not be constant.

The upper transparent organic film TOL is disposed in spaces between adjacent light blocking patterns BL. Each of the light blocking patterns BL may be formed within an opening formed in the upper transparent organic film TOL, or the upper transparent organic film TOL may be formed at a region in which the plurality of light blocking patterns BL are not formed. In addition, according to an embodiment, the upper transparent organic film TOL may be disposed on the plurality of light blocking patterns BL.

An embodiment of a structure in which the plurality of light blocking patterns BL and the upper transparent organic film TOL of FIG. 2 are disposed at an upper portion of the light emitting diode of FIG. 1 is shown in FIG. 3.

In the embodiment of FIG. 3, some light blocking patterns BL may cross light emitting diodes, and other light blocking patterns BL may be disposed between adjacent light emitting diodes not to overlap the adjacent light emitting diodes in a plan view.

That is, each light emitting layer EMLr, EMLg, or EMLb and/or the opening OPr, OPg, or OPb of the pixel defining film 380 overlaps one of the some light blocking patterns BL, and the one of the some light blocking patterns BL passes through a center of each light emitting layer EMLr, EMLg, or EMLb and/or the opening OPr, OPg, or OPb of the pixel defining film 380. Each of the other light blocking patterns BL does not overlap the light emitting layer EMLr, EMLg, or EMLb and/or the opening OPr, OPg, or OPb of the pixel defining film 380 in a plan view and is disposed on the pixel defining film 380 which is disposed between adjacent light emitting layer EMLr, EMLg, or EMLb and/or the opening OPr, OPg, or OPb of the pixel defining film 380 to overlap the pixel defining film 380. That is a pair of light blocking patterns BL is disposed on one side and the other side of the each of the light emitting layer EMLr, EMLg, or EMLb and/or the opening OPr, OPg, or OPb of the pixel defining film 380.

The cross-section line IV-IV of FIG. 3 is formed at the center of the green light emitting layer EMLg, so a cross-sectional structure of FIGS. 4A and 4B will be described in detail based on the green light emitting layer EMLg.

Figure 4A:
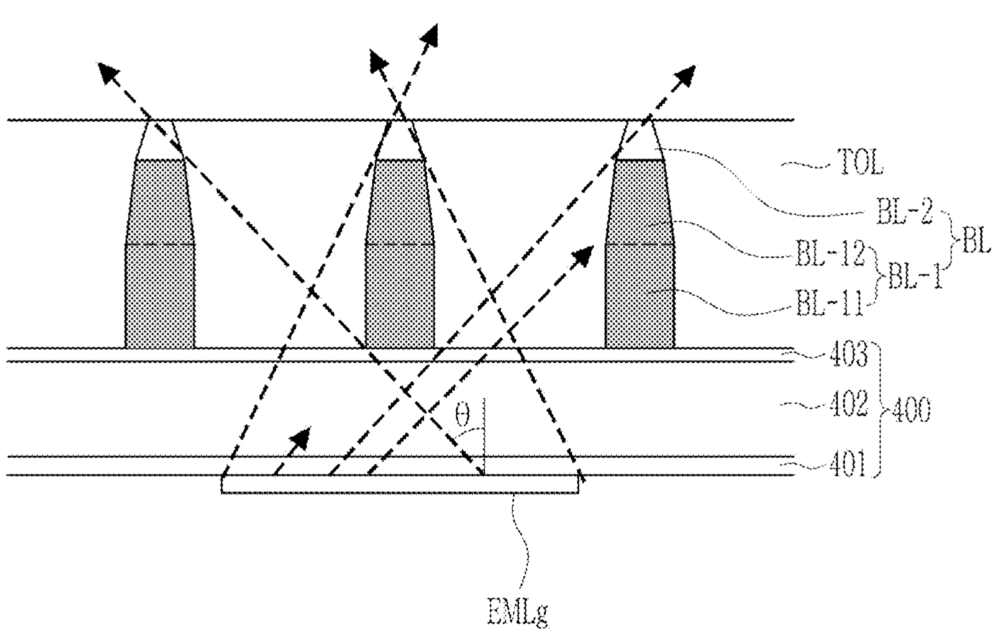
FIGS. 4A and 4B are cross-sectional views cut along a line IV-IV of FIG. 3.
Figure 4B:
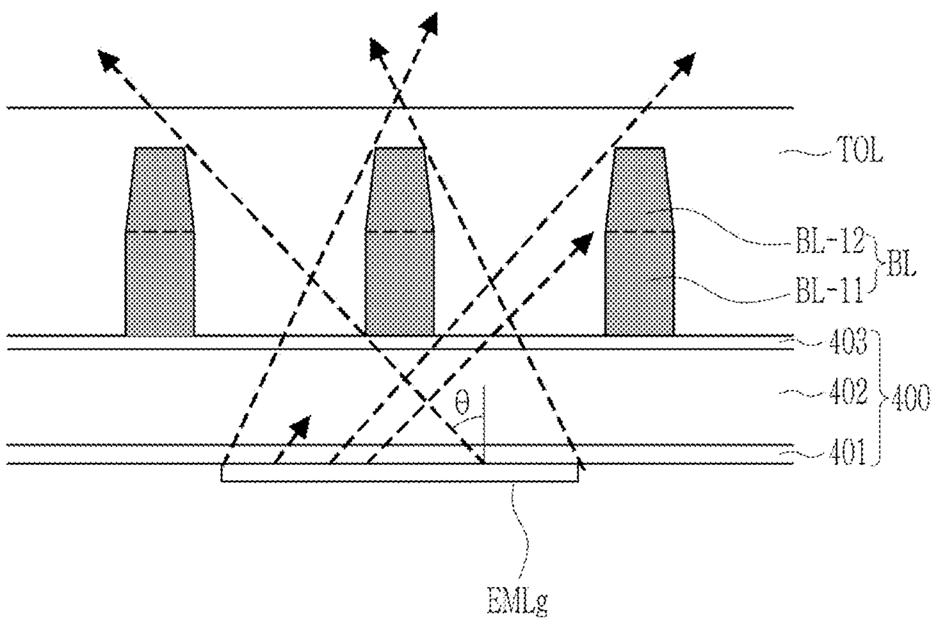

In FIGS. 4A and 4B, only the light emitting layer EMLg is briefly shown, and the anode and the cathode that may be disposed above and below the light emitting layer EMLg are omitted. The light emitting diode may emit light from the light emitting layer EMLg, and the light emitted from the light emitting layer EMLg may be emitted in various directions. However, light is not transferred at an angle greater than or equal to a certain angle due to the light blocking pattern BL disposed at an upper portion of the light emitting layer EMLg. As a result, a viewing angle of the light emitting display device is limited.

The viewing angle of the light emitting display device may be determined according to a distance between the light blocking pattern BL and the light emitting layer EMLg, an interval between adjacent light blocking patterns BL, and a width and a height of the light blocking pattern BL. Hereinafter, a characteristic of the light blocking pattern BL according to the present embodiment will be described.

Figure 12:
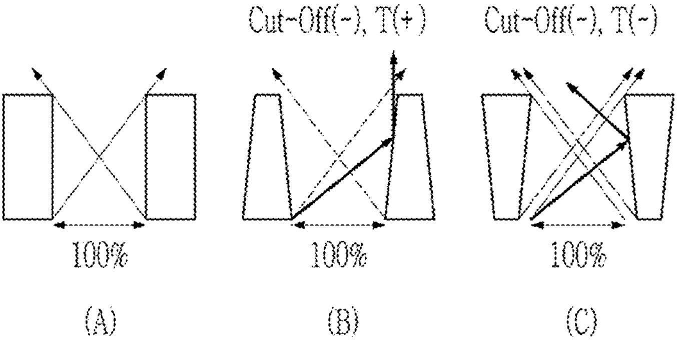
Figure 13:
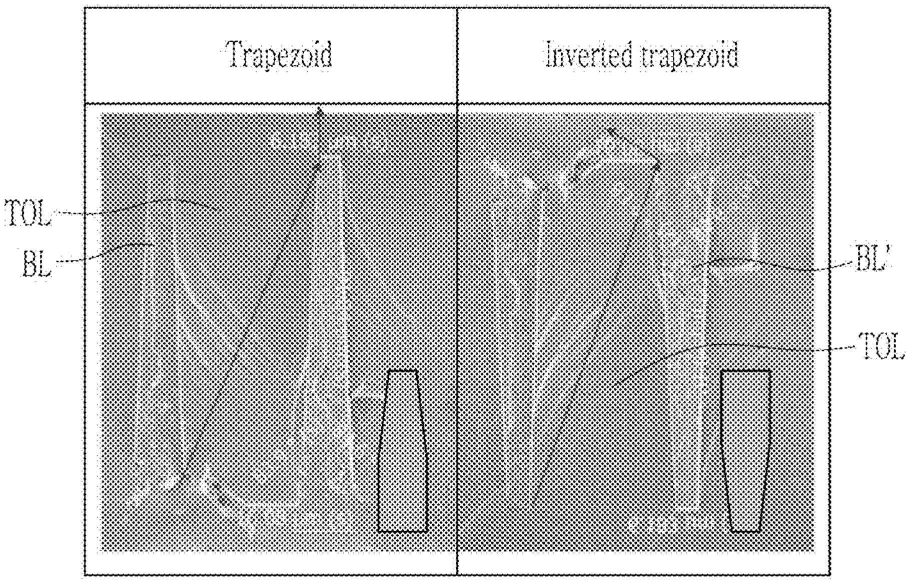

Referring to FIG. 4A, the light blocking pattern BL has a pillar shape and includes a structure in which a width of the light blocking pattern BL decreases toward an upper portion of the light blocking pattern. Referring to FIGS. 12 to 14, the structure in which the width of the light blocking pattern BL decreases toward the upper portion of the light blocking pattern has the advantage of increasing transmittance of a front surface while preventing light from traveling to a side surface.

Specifically, the light blocking pattern BL includes a first portion BL-1 and a second portion BL-2. The first portion BL-1 and the second portion BL-2 may be formed of materials having different etching rates, and the etching rate of the first portion BL-1 may be lower than that of the second portion BL-2.

The first portion BL-1 may be formed of a material capable of blocking light, and may be formed of the same material as a black matrix such as an organic material including a black color pigment. Here, the black color pigment may include a light blocking material, and the light blocking material may include carbon black, carbon nanotube, a resin or a paste including a black dye, a metal particle (for example, nickel, aluminum, molybdenum, titanium, tungsten, silver, copper, gold, or an alloy thereof), a metal oxide particle (for example, chromium nitride), or the like. According to an embodiment, the first portion BL-1 of the light blocking pattern BL may be formed of a metal such as nickel, aluminum, molybdenum, titanium, tungsten, silver, copper, or gold and an alloy thereof. In addition, the first portion BL-1 may be formed of a single layer or multiple layers of the above material.

The first portion BL-1 according to the embodiment of FIG. 4A may include a (1-1)-th portion BL-11 having a pillar shape and having a constant width, and a (1-2)-th portion BL-12 having a trapezoidal shape in a cross-sectional view and having a width decreasing toward an upper portion of the (1-2)-th portion BL-12. Although heights of the (1-1)-th portion BL-11 and the (1-2)-th portion BL-12 are shown to be almost the same in FIGS. 4A, 4B and 4C, the height of the (1-2)-th portion BL-12 may be greater than that of the (1-1)-th portion BL-11 according to an embodiment so that more than half of the first portion BL-1 have an inclined side surface.

On the other hand, the second portion BL-2 is disposed on the first portion BL-1. The second portion BL-2 may be formed of a material having a higher etching rate than the first portion BL-1 so as to have a structure in which an upper portion of the light blocking pattern BL has a relatively narrow width. In FIG. 4A, the second portion BL-2 may be formed of a transparent organic material which is different from the first portion BL-1. Here, the organic material may include one or more materials selected from the group consisting of polyimide, polyamide, an acryl resin, benzocyclobutene, and a phenol resin.

The second portion BL-2 may have a trapezoidal shape in a cross-sectional view, and may have a structure in which a width of the second portion BL-2 decreases toward an upper portion of the second portion BL-2. In the embodiment of FIG. 4A, a lower surface of the second portion BL-2 has the same width as a width of an upper surface of the first portion BL-1. However, according to an embodiment, the lower surface of the second portion BL-2 may have a width different from a width of the upper surface of the first portion BL-1, and the width of the lower surface of the second portion BL-2 may be less than the width of the upper surface of the first portion BL-1.

The second portion BL-2 may have an inclined side surface, and a side surface slope of the second portion BL-2 and a side surface slope of the first portion BL-1 may be different from each other. According to an embodiment, a side surface of the first portion BL-1 may be steeper than a side surface of the second portion BL-2.

A width and a side surface slope of the second portion BL-2 and a width and a side surface slope of the first portion BL-1 may be determined based on the etching rate, and various structures may be formed according to a difference in the etching rate.

As shown in FIG. 4A, because the second portion BL-2 does not block light in an embodiment in which the second portion BL-2 is formed of the transparent organic material, the second portion BL-2 may not block light from traveling in one direction. Specifically, the light blocking pattern BL may serve to block light emitted from the light emitting layer EMLg from being emitted at a certain angle (hereinafter also referred to as a viewing angle) θ or more with respect to a normal line, and the light may be blocked by the first portion BL-1 of the light blocking pattern BL.

A height of the first portion BL-1 of the light blocking pattern BL according to an embodiment may be greater than or equal to 30 μm and less than or equal to 40 μm, and a height of the second portion BL-2 of the light blocking pattern BL according to the embodiment may be about 5 μm.

A width of the light blocking pattern BL may be 1.5 μm or more and 6.5 μm or less, and an interval between adjacent light blocking patterns BL may be 5 μm or more and 20 μm or less.

In order to prevent light from being provided at the certain angle θ or more with respect to the normal line, a height of the light blocking pattern BL is greater than a width of the light blocking pattern BL, and a ratio of the height to the width of the light blocking pattern BL may be 4.6 or more and 26.7 or less.

If an interval between the light blocking patterns BL becomes closer, the blocked viewing angle θ decreases so that the blocking effect increases but there is a disadvantage in that transmittance deteriorates. Therefore, it is necessary to consider both the transmittance and the blocked viewing angle θ, and in an embodiment, the transmittance may be set to 80% and the blocked viewing angle θ may be set to 30 degrees. On the other hand, in an embodiment in which the blocked viewing angle θ is greater than 30 degrees, light may be controlled not to travel at various angles, and the blocked viewing angle θ may be set to an angle of 30 degrees or more and 45 degrees or less. Here, light blocked at an angle may be said to be blocked if luminance is 1% or less at the angle.

On the other hand, the transmittance may generally not reach much less than 80% when the light blocking pattern with a constant width is used, so that in order to increase the transmittance, the light blocking pattern BL including a portion having a reduced width is used as shown in FIG. 4A. This will be described later with reference to FIGS. 12 to 14.

The upper transparent organic film TOL is disposed between the light blocking patterns BL, and the upper transparent organic film TOL may be formed using a transparent organic material having a low refractive index. Various materials may be used as the transparent organic material, and in an embodiment, 1.47 may be used as the low refractive index. Here, the upper transparent organic film TOL and the second portion BL-2 of the light blocking pattern BL may be formed of the same organic material or different organic materials.

FIG. 4A shows that heights of the upper transparent organic film TOL and an upper surface of the light blocking pattern BL are identical, but according to an embodiment, the upper transparent organic film TOL may be disposed on the upper surface of the light blocking pattern BL to cover the light blocking pattern BL.

In FIG. 4A, an encapsulation layer 400 is disposed below the upper transparent organic film TOL, and the encapsulation layer 400 has a structure including a lower inorganic encapsulation film 401, an organic encapsulation film 402, and an upper inorganic encapsulation film 403.

The light emitting diode is disposed at a lower portion of the encapsulation layer 400, and only the light emitting layer EMLg is briefly illustrated in FIG. 4A. A detailed lower structure will be described with reference to FIGS. 18 and 19.

According to an embodiment, a sensing insulating layer and a plurality of sensing electrodes may be disposed between the upper transparent organic film TOL and the light blocking pattern BL and the encapsulation layer 400 to sense a touch. A structure for sensing the touch will also be described with reference to FIGS. 18 and 19.

According to an embodiment, the light blocking pattern BL may be disposed in contact with an insulating film formed of an inorganic material, and the insulating film in contact with the light blocking pattern BL may be the upper inorganic encapsulation film 403 of the encapsulation layer 400 or may be an inorganic insulating film of a sensing insulating layer covering a sensing electrode formed to sense a touch. The inorganic insulating film may include silicon oxide ($SiO_x$) or silicon nitride ($SiN_x$).

The embodiment described above in which the light blocking pattern BL is formed within the light emitting display device differs from a comparative example in which a viewing angle is reduced by attaching a film to a front surface of a light emitting display device in the following points.

First of all, in a case of attaching the film, a problem of misalignment may occur, and a moire phenomenon may occur when the film is incorrectly attached. However, in the present embodiment, there may be no misalignment problem, and the moire phenomenon may be easily removed by adjusting the interval between the light blocking patterns BL.

In addition, the comparative example in which the film is attached has a disadvantage in that manufacturing cost is increased and transmittance is reduced due to optical loss occurring at an interface due to an adhesive or the like when the film is attached.

In addition, in the comparative example in which the film is attached, a thickness of the film is about 105 μm, but the embodiment may be formed to a thickness of about 50 μm so that the light emitting display device is thinly formed.

Referring to FIGS. 3 and 4(A), some of the plurality of light blocking patterns BL overlap the light emitting diode or the light emitting layer EMLr, EMLg, or EMLb in a plan view, and the others of the plurality of light blocking patterns BL overlap the pixel defining film 380 in a plan view.

In the embodiments of FIGS. 3 and 4(A), each of the light emitting layers EMLr, EMLg, and EMLb overlaps one light blocking pattern BL, but the number and position of the overlapping light blocking patterns BL may vary.

An embodiment of various dispositions of each light emitting layer EMLr, EMLg, or EMLb and/or the opening OPr, OPg, or OPb of the pixel defining film 380 and the light blocking pattern BL will be described through FIG. 5.

FIG. 4B illustrate a case in which the second portion BL-2 is omitted from the embodiment of FIG. 4A when the second portion BL-2 of the light blocking pattern BL has the same organic material as the upper transparent organic film TOL. According to FIG. 4B, the upper transparent organic film TOL is directly disposed on an upper surface of the light blocking pattern which includes the (1-1)-th portion BL-11 and the (1-2)-th portion BL-12 when forming the upper transparent organic film TOL between adjacent light blocking patterns BL.

Figure 5:
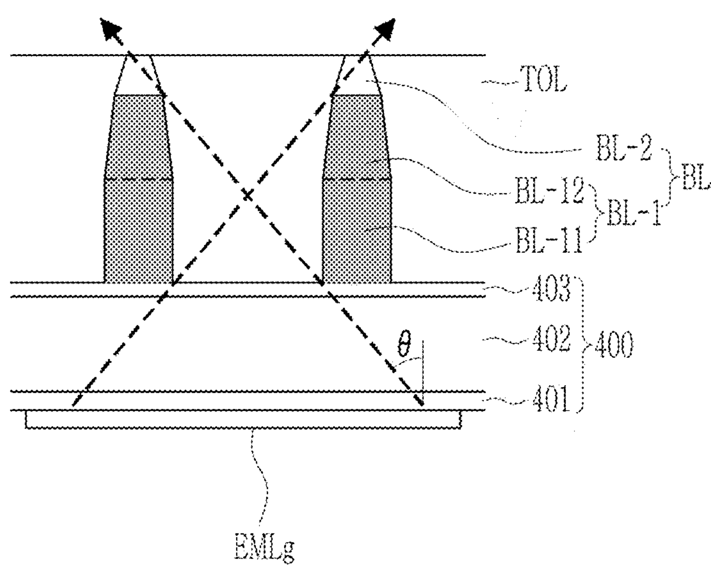
FIG. 5 is a cross-sectional view of a light emitting display device according to another embodiment.

FIG. 5 is a cross-sectional view of a light emitting display device according to another embodiment.

Unlike the embodiments of FIGS. 3 and 4, the embodiment of FIG. 5 is an embodiment in which one light emitting layer EMLg overlaps two light blocking patterns BL.

If a height of the light blocking pattern BL is equal to an interval between the light blocking patterns BL as shown in FIG. 5 even if the light emitting layer EMLg overlaps the two light blocking patterns BL, the blocked viewing angle θ may be the same.

In FIGS. 3 to 5, the light blocking pattern BL has a structure disposed symmetrically with respect to the center of the light emitting layer EMLg or a center line. However, according to an embodiment, the light blocking patterns BL may be formed at a position that is not symmetrical with respect to the center of the light emitting layer EMLg or the center line.

Hereinafter, a manufacturing method for forming the light blocking pattern BL according to an embodiment will be described through FIGS. 6A, 6B and 6C.

FIGS. 6A, 6B and 6C are views sequentially showing the manufacturing method for forming the light blocking pattern of the light emitting display device according to an embodiment.

In FIGS. 6A, 6B and 6C, only the light blocking pattern BL is shown, and a layer disposed below the light blocking pattern BL is omitted.

Referring to FIG. 6A, in order to form the first portion BL-1 and the second portion BL-2 of the light blocking pattern BL on an inorganic insulating film (for example, the upper inorganic encapsulation film 403 of FIGS. 4A, 4B and 4C), a material for the first portion BL-1*m* and a material for the second portion BL-2*m* are sequentially stacked. Here, the material for the first portion BL-1*m* may include a material capable of blocking light, and may include the same material as a black matrix such as an organic material including a black color pigment. Here, the black color pigment may include a light blocking material, and the light blocking material may include carbon black, carbon nanotube, a resin or a paste including a black dye, a metal particle (for example, nickel, aluminum, molybdenum, titanium, tungsten, silver, copper, gold, or an alloy thereof), a metal oxide particle (for example, chromium nitride), or the like. On the other hand, according to the embodiment, the material for the first portion BL-1*m* may be formed of a metal such as nickel, aluminum, molybdenum, titanium, tungsten, silver, copper, or gold and an alloy thereof. In addition, the material for the first portion BL-1*m* may be formed of a single layer or multiple layers of the above material. In addition, the material for the second portion BL-2*m* may be formed of a transparent organic material that has a different etching rate from the material for the first portion BL-1*m*. Here, the organic material may include one or more materials selected from the group consisting of polyimide, polyamide, an acryl resin, benzocyclobutene, and a phenol resin. On the other hand, the material for the second portion BL-2*m* may have a different etching rate from the material for the first portion BL-1*m*, and the etching rate of the material for the second portion BL-2*m* may be higher than that of the material for the first portion BL-1*m*. On the other hand, according to an embodiment, the material for the second portion BL-2*m* may be a material with a different etching rate from the material for the first portion BL-1*m*, may be formed of an opaque material, and may be formed of an inorganic insulating film or an oxide film. Therefore, the material for the second portion BL-2*m* may include opaque amorphous carbon (or opaque a-carbon), an inorganic material such as silicon oxide ($SiO_x$), silicon nitride ($SiN_x$), or silicon oxynitride (SiON), or an oxide such as indium zinc oxide (IZO), indium tin oxide (ITO), or indium gallium zinc oxide (IGZO).

In FIG. 6A, a state in which the sequentially stacked material for the first portion BL-1*m* and material for the second portion BL-2*m* are etched and the material for the second portion BL-2*m* is etched is shown. Here, the etching may be dry etching, and may be wet etching according to an embodiment. In FIGS. 6A, 6B and 6C, a direction of the etching is indicated by an arrow. Although not shown in FIG. 6A, a mask (for example, a hard mask) may be disposed on the material for the second portion BL-2*m*. The hard mask according to an embodiment may include indium zinc oxide (IZO) or indium tin oxide (ITO).

Referring to the arrow indicating the etching direction in FIG. 6A, when the material for the second portion BL-2*m* is etched, the material for the second portion BL-2*m* is strongly etched in a depth direction, but the etching also proceeds in a horizontal direction.

After that, referring to FIG. 6B, it is shown that not only the material for the second portion BL-2*m* but also the material for the first portion BL-1*m* is together etched. When the etching rate of the material for the second portion BL-2*m* is higher than that of the material for the first portion BL-1*m*, the material for the second portion BL-2*m* may be more strongly etched in the horizontal direction than the material for the first portion BL-1*m*.

In addition, because the material for the first portion BL-1*m* has a low etching rate, a degree of etching of the material for the first portion BL-1*m* in the depth direction and the horizontal direction is smaller than a degree of etching of the material for the second portion BL-2*m* in the depth direction and the horizontal direction. Therefore, the material for the second portion BL-2*m* may be more deeply etched than the material for the first portion BL-1*m*, so that a width of the material for the second portion BL-2*m* is narrowed. In addition, as the etching proceeds, an exposed portion may be etched in the horizontal direction and some side surfaces may be etched, so that an overall inclined side surface is formed. In this case, a slope of a side surface formed by etching the material for the first portion BL-1*m* and a slope of a side surface formed by etching the material for the second portion BL-2*m* may be different from each other, and the side surface of the material for the first portion BL-1*m* may be steeper than the side surface of the material for the second portion BL-2*m*.

In FIG. 6C, which illustrates a state in which the etching is completed, and the light blocking pattern BL of FIGS. 4A and 4B is completed.

The inclined side surface may be formed by a difference in an etching rate between the material for the first portion BL-1*m* and the material for the second portion BL-2*m*. Because the etching rate in the horizontal direction decreases as the etching proceeds deeper, the (1-1)-th portion BL-11 having a constant width may be formed at a lower portion of the first portion BL-1. Therefore, the (1-2)-th portion BL-12 having a trapezoidal shape in a cross-sectional view and having a width decreasing toward an upper portion of the (1-2)-th portion BL-12 may be formed at an upper portion of the first portion BL-1, and the (1-1)-th portion BL-11 having a pillar shape and having a constant width may be formed at a lower portion of the first portion BL-1.

In FIG. 6C, a lower surface of the second portion BL-2 of the light blocking pattern BL has the same width as an upper surface of the first portion BL-1. However, according to an embodiment, a width of the lower surface of the second portion BL-2 may be narrower than a width of the upper surface of the first portion BL-1. In addition, according to an embodiment, a slope of a side surface of the first portion BL-1 and a slope of a side surface of the second portion BL-2 may be different from each other, and a side surface of the first portion BL-1 may be steeper than a side surface of the second portion BL-2.

On the other hand, according to an embodiment, the (1-1)-th portion BL-11 having a pillar shape may not be formed at the first portion BL-1, but may be formed in a structure in which a width of the (1-1)-th portion BL-11 increases from an upper portion to a lower portion thereof.

After that, although not shown in the drawings, a transparent organic material may be provided between the formed plurality of light blocking patterns BL so that the upper transparent organic film TOL is formed as shown in FIGS. 4A and 4B. According to an embodiment, the upper transparent organic film TOL may cover the plurality of light blocking patterns BL.

The upper transparent organic film TOL may be formed using a transparent organic material having a low refractive index, and the second portion BL-2 of the light blocking pattern BL may be formed of the same organic material as or different organic materials than the upper transparent organic film TOL.

As disclosed in FIG. 4B, when the second portion BL-2 of the light blocking pattern BL has the same organic material as the upper transparent organic film TOL, the material for the second portion BL-2*m* may not be disposed on the material for the first portion BL-1*m* and the upper transparent organic film TOL may be formed directly on the upper surface of the (1-2)-th portion BL-12 when forming the upper transparent organic film TOL between adjacent first portions BL-1 of the light blocking patterns BL.

In the embodiment of FIGS. 6A, 6B and 6C, the second portion BL-2 of the light blocking pattern BL having a different etching rate is etched in order to form the light blocking pattern BL in a structure in which a width of the light blocking pattern BL decreases toward an upper portion of the light blocking pattern. However, a case in which the light blocking pattern BL is formed in the structure in which the width of the light blocking pattern BL decreases toward the upper portion of the light blocking pattern without using the second portion BL-2 having the different etching rate may not include the second portion BL-2.

As described above, the manufacturing method of the light blocking pattern BL according to the embodiment was described in detail through FIGS. 6A, 6B and 6C.

A cross-sectional structure of the light blocking pattern BL actually formed in the same manner as that of FIGS. 6A, 6B and 6C will be described through FIGS. 7 and 8.

Figure 7:
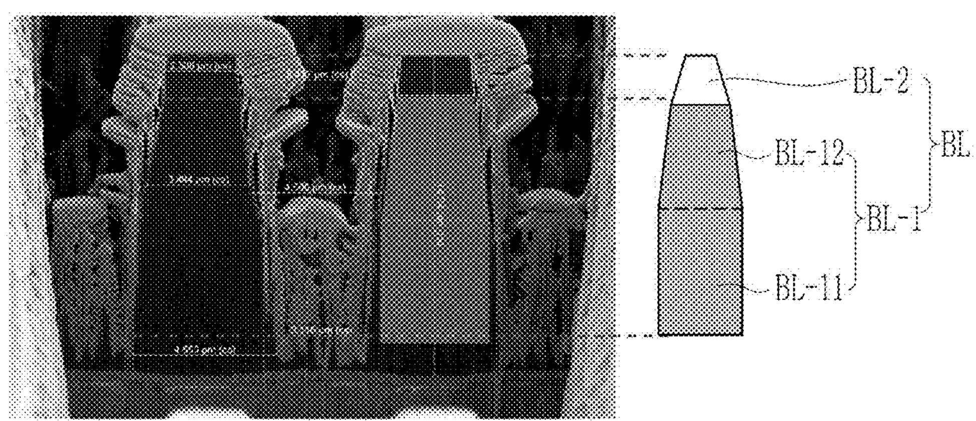
FIGS. 7 and 8 are photographs of a cross-section of the light blocking pattern formed according to the embodiment of FIGS. 6A, 6B and 6C.
Figure 8:
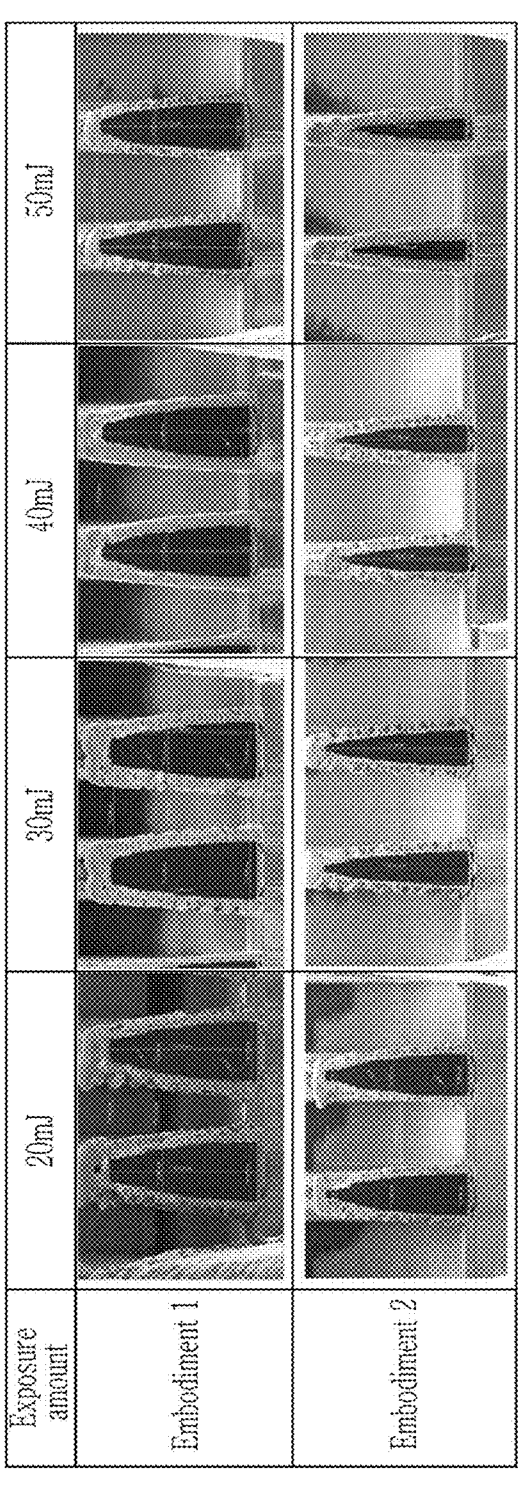

FIGS. 7 and 8 are photographs of a cross-section of the light blocking pattern formed according to the embodiment of FIGS. 6A, 6B and 6C.

First, in FIG. 7, the light blocking pattern BL formed by FIGS. 6A, 6B and 6C is shown corresponding to the structure of the light blocking pattern BL of FIGS. 4A, 4B and 4C.

Referring to the left photograph of FIG. 7, it may be confirmed that by the process shown in FIGS. 6A, 6B and 6C, the light blocking pattern BL may include the first portion BL-1 and the second portion BL-2, the (1-2)-th portion BL-12 having a trapezoidal shape in the cross-section and having the width decreasing toward the upper portion of the (1-2)-th portion BL-12 is formed at an upper portion of the first portion BL-1, and the (1-1)-th portion BL-11 having a pillar shape and having a constant width is formed at a lower portion of the first portion BL-1.

On the other hand, in FIG. 8, a change in the cross-sectional structure of the light blocking pattern BL according to an exposure amount is shown. FIG. 8 is an embodiment in which a material constituting the light blocking pattern BL is formed of an organic material having a photosensitive characteristic, and the etching rate is changed according to the exposure amount.

In FIG. 8, the cross-sectional structure formed by exposing while changing the exposure amount to 20 mJ, 30 mJ, 40 mJ, or 50 mJ is photographed for Example 1 and Example 2. Here, Embodiment 1 is an example in which a width of a line is formed as 5.9 μm, an interval of lines is formed as 2.1 μm, and then the line is exposed, and Embodiment 2 is an example in which the width of the line is formed as 4.5 μm, the interval of the lines is formed as 3.5 μm, and then the line is exposed.

Referring to FIG. 8, as in a case of the exposure amount of 20 mJ or 30 mJ of Example 1 and in a case of the exposure amount of 20 mJ of Example 2, it is preferable to control an upper surface of the light blocking pattern BL to be greater than a predetermined width. This is because it is difficult to block light from traveling in a certain direction if a width of the upper surface is too narrow.

The exposure amount of FIG. 8 may be changed according to the quality of a material to be etched.

In Table 1 below, etching rates and etching ratios according to a plurality of materials for the first portion BL-1*m* and materials for the second portion BL-2*m* are described.

TABLE 1

| | Etching rate of material for second portion | Etching rate of material for first portion | Etching ratio |
|---|---|---|---|
| Embodiment a | 1.7 μm | 0.9 μm | 1.9 |
| Embodiment b | 1.6 μm | 0.8 μm | 1.6 |
| Embodiment c | 1.4 μm | 0.7 μm | 1.5 |

The material for the first portion BL-1*m* or the material for the second portion BL-2*m* presented in Table 1 is a material of the light blocking pattern BL having the inclined side surface shown in FIG. 4A that is formed by the manufacturing method of FIGS. 6A, 6B and 6C and has the above etching rate. In Table 1 above, the etching rate is described as a dry-etched width/thickness (μm) for the same time, the etching ratio is a ratio of the etching rate of the material for the second portion BL-2*m* to the etching rate of the material for the first portion BL-1*m*, and the etching rate or the etching ratio is a rounded value.

Referring to the etching ratio of Table 1, it may be confirmed that if the ratio of the etching rate of the material for the second portion BL-2*m* to the etching rate of the material for the first portion BL-1*m* has a value of 1.4 or more and 1.9 or less, the light blocking pattern BL having the inclined side surface shown in FIG. 4A is formed.

Hereinafter, the light blocking pattern BL of an embodiment different from that of FIG. 4A will be described through FIGS. 9 to 11, and the embodiment of FIG. 9 will be first described.

Figure 9:
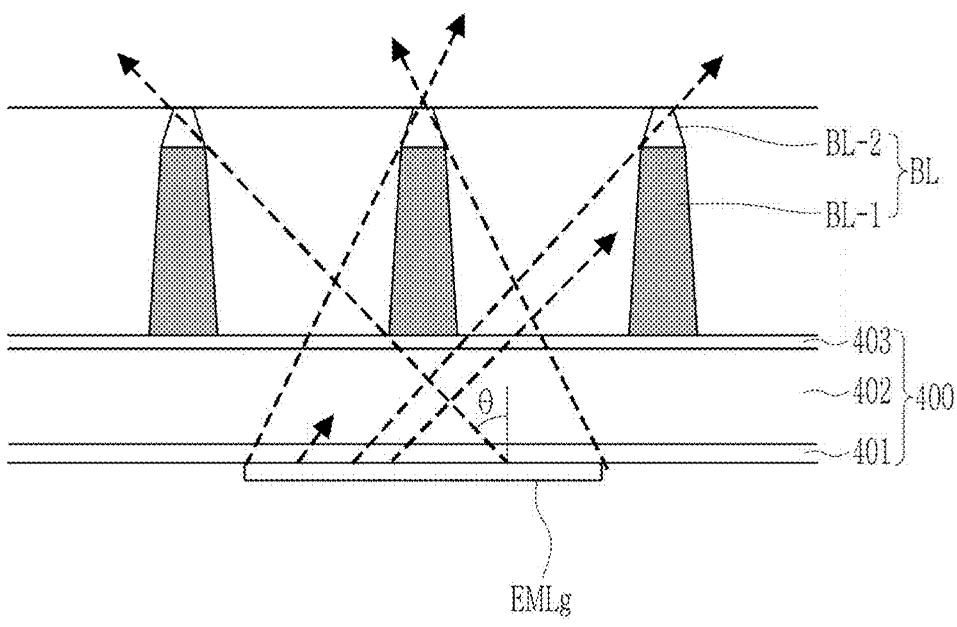
FIG. 9 is a cross-sectional view of a light emitting display device according to another embodiment.

FIG. 9 is a cross-sectional view of a light emitting display device according to another embodiment.

When FIG. 9 is compared with FIGS. 4A, 4B and 4C, there is a difference in that the first portion BL-1 of the light blocking pattern BL does not include a portion having a pillar shape and having a constant width, but includes only a portion having a trapezoidal shape in a cross-section and having a width decreasing toward an upper portion thereof.

Specifically, the light blocking pattern BL according to the embodiment of FIG. 9 may have the following characteristic.

The light blocking pattern BL according to the embodiment of FIG. 9 may include the first portion BL-1 and the second portion BL-2, the first portion BL-1 and the second portion BL-2 may be formed of materials having different etching rates, and the etching rate of the first portion BL-1 may be lower than that of the second portion BL-2.

The first portion BL-1 may be formed of a material capable of blocking light, and has a structure having the trapezoidal shape in the cross-section and having the width decreasing toward the upper portion thereof.

On the other hand, the second portion BL-2 may be disposed on the first portion BL-1, and the second portion BL-2 may be formed of a material having a higher etching rate than the first portion BL-1 so as to have a structure in which an upper portion of the light blocking pattern BL has a relatively narrow width. In the embodiment of FIG. 9, the second portion BL-2 may be formed of a transparent organic material unlike the first portion BL-1. The second portion BL-2 may also have the trapezoidal shape in the cross-section, and may also have the width decreasing toward the upper portion thereof.

In the embodiment of FIG. 9, a lower surface of the second portion BL-2 has the same width as a width of an upper surface of the first portion BL-1. However, according to an embodiment, the lower surface of the second portion BL-2 may have a width different from a width of the upper surface of the first portion BL-1, and the width of the lower surface of the second portion BL-2 may be less than the width of the upper surface of the first portion BL-1.

The second portion BL-2 may have an inclined side surface, and a side surface slope of the second portion BL-2 and a side surface slope of the first portion BL-1 may be different from each other. According to an embodiment, a side surface of the first portion BL-1 may be steeper than a side surface of the second portion BL-2.

A width and a side surface slope of the second portion BL-2 and a width and a side surface slope of the first portion BL-1 may be determined based on the etching rate, and various structures may be formed according to a difference in the etching rate.

As shown in FIG. 9, because the second portion BL-2 does not block light in an embodiment in which the second portion BL-2 is formed of the transparent organic material, the second portion BL-2 may not block light from traveling in one direction. Specifically, the light blocking pattern BL may serve to block light emitted from the light emitting layer EMLg from being emitted at a certain angle (hereinafter also referred to as a viewing angle) θ or more with respect to a normal line, and the light may be blocked by the first portion BL-1 of the light blocking pattern BL.

In order to prevent light from being provided at the certain angle θ or more with respect to the normal line, a height of the light blocking pattern BL is greater than a width of the light blocking pattern BL, and a ratio of the height to the width may be 4.6 or more and 26.7 or less.

If an interval between the light blocking patterns BL becomes closer, the blocked viewing angle θ decreases so that blocking effect of the light blocking pattern increases but there is a disadvantage in that transmittance of the light blocking pattern deteriorates. Therefore, it is necessary to consider both the transmittance and the blocked viewing angle θ, and in an embodiment, the transmittance may be set to 80% and the blocked viewing angle θ may be set to 30 degrees. On the other hand, in an embodiment in which the blocked viewing angle θ is greater than 30 degrees, light may be controlled not to travel at various angles, and the blocked viewing angle θ may be set to an angle of about 45 degrees. Here, light blocked at an angle may be said to be blocked if luminance is 1% or less at the angle.

The upper transparent organic film TOL is disposed between the light blocking patterns BL, and the upper transparent organic film TOL may be formed using a transparent organic material having a low refractive index. Various materials may be used as the transparent organic material, and in an embodiment, 1.47 may be used as the low refractive index. Here, the upper transparent organic film TOL and the second portion BL-2 of the light blocking pattern BL may be formed of the same organic material or different organic materials.

As disclosed with reference to FIG. 4B, the second portion BL-2 may be omitted from the embodiment of FIG. 9 when the second portion BL-2 of the light blocking pattern BL has the same organic material as the upper transparent organic film TOL.

FIG. 9 shows that heights of the upper transparent organic film TOL and an upper surface of the light blocking pattern BL are identical, but according to an embodiment, the upper transparent organic film TOL may be disposed on the upper surface of the light blocking pattern BL to cover the light blocking pattern BL.

Hereinafter, the light blocking pattern BL according to another embodiment will be described through FIGS. 10 and 11.

Figure 10:
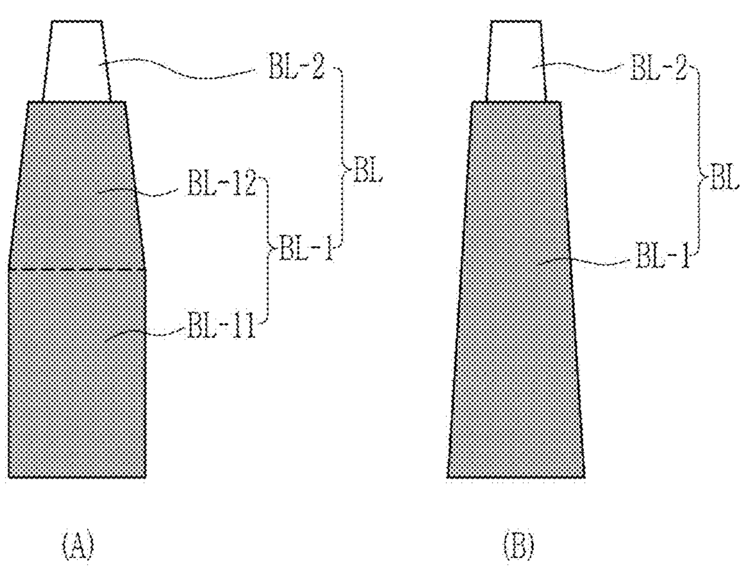
FIGS. 10 and 11 are cross-sectional views of a light blocking pattern according to another embodiment.
Figure 11:
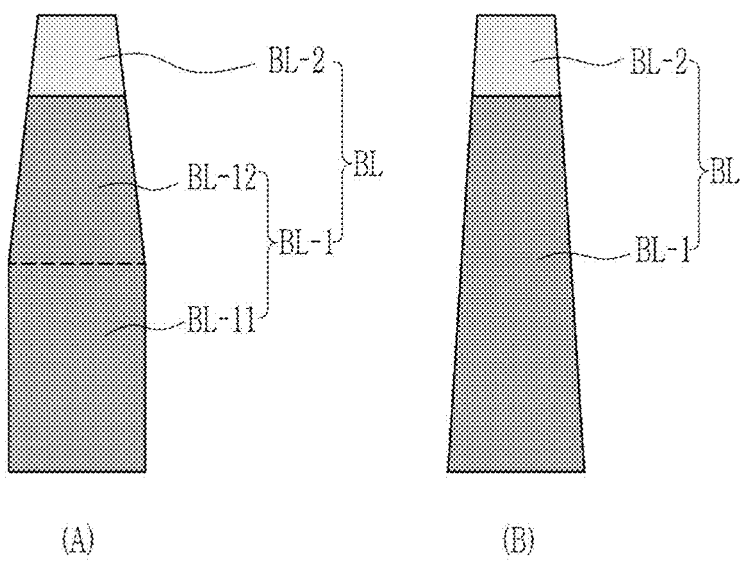

FIGS. 10 and 11 are cross-sectional views of the light blocking pattern according to another embodiment.

The embodiment in which widths of a lower surface of the second portion BL-2 of the light blocking pattern BL and an upper surface of the first portion BL-1 of the light blocking pattern BL are the same has been described above. However, according to an embodiment, the lower surface of the second portion BL-2 may have a width different from a width of the upper surface of the first portion BL-1, and an embodiment in which the width of the lower surface of the second portion BL-2 is narrower than the width of the upper surface of the first portion BL-1 will be described through FIG. 10.

FIG. 10(A) is a modified embodiment of FIGS. 4A, 4B and 4C, and FIG. 10(B) shows a modified embodiment of FIG. 9.

In FIG. 10, the width of the lower surface of the second portion BL-2 is narrower than the width of the upper surface of the first portion BL-1, and because the etching rate of the first portion BL-1 is lower than that of the second portion BL-2, the second portion BL-2 is more deeply etched and widths at an interface between the second portion BL-2 and the first portion BL-1 are formed to be different from each other.

In FIGS. 4, 9, and 10, the second portion BL-2 may be formed of a transparent organic material, but according to an embodiment, even though the second portion BL-2 is formed of the transparent organic material, the second portion may be formed of an inorganic material rather than the organic material or may be formed by including an oxide. That is, the second portion BL-2 may include an inorganic material such as silicon oxide ($SiO_x$), silicon nitride ($SiN_x$), or silicon oxynitride (SiON), or an oxide such as indium zinc oxide (IZO), indium tin oxide (ITO), or indium gallium zinc oxide (IGZO).

As disclosed with reference to FIG. 4B, the second portion BL-2 may be omitted from the embodiment of FIG. 10 when the second portion BL-2 of the light blocking pattern BL has the same organic material as the upper transparent organic film TOL.

On the other hand, according to an embodiment, the second portion BL-2 may have a non-transparent characteristic that is shown in FIG. 11.

In FIG. 11, hatching is added to the second portion BL-2 to indicate that it is not transparent, and only modified structures of the embodiments of FIGS. 4 and 9 are shown. According to an embodiment, even in the embodiment of FIG. 10, the second portion BL-2 may have a non-transparent characteristic.

In FIG. 11, the second portion BL-2 may include opaque amorphous carbon (a-carbon).

In addition, in the embodiment of FIG. 11, the second portion BL-2 may include the same material as the first portion BL-1, and in this case, etching rates of the second portion BL-2 and the first portion BL-1 need to be different from each other.

In the above description, the structures of various light blocking patterns BL have been disclosed.

Hereinafter, when the light blocking pattern BL has a structure having a trapezoidal shape in a cross-section and having a width decreasing toward the upper portion thereof, transmittance increases. This will be described in detail in comparison with a comparative example with FIGS. 12 to 14.

FIGS. 12 to 14 are views for comparing and explaining characteristics of a cross-sectional shape of the light blocking pattern.

First, FIG. 12 schematically illustrates comparing viewing angles and transmittances based on shapes of three light blocking patterns.

FIG. 12(A) shows a light blocking pattern of a pillar structure with a constant width that is the comparative example, FIG. 12(B) shows a light blocking pattern having a cross-section of a trapezoid having a width decreasing toward an upper portion thereof that corresponds to the present embodiment, and FIG. 12(C) shows a light blocking pattern having a cross-section of an inverted trapezoid having a width increasing toward an upper portion thereof that is the comparative example.

In FIG. 12, "Cut-Off" denotes blocking light from traveling to a side surface and corresponds to the viewing angle, and "T" denotes the transmittance of the light blocking pattern BL.

Because a width of an upper surface of the light blocking pattern is not reduced in the comparative example of FIG. 12 (A), an angle of the light traveling to the side surface of the light blocking pattern may be formed to be the smallest. In contrast, a width of an upper surface of the light blocking pattern may be narrow in FIG. 12 (B) so that an angle for cutting off light is reduced, and the angle of the light traveling to the side surface in FIG. 12 (B) may be somewhat larger than that in FIG. 12 (A). On the other hand, in the comparative example of FIG. 12 (C), a width of an upper surface of the light blocking pattern is the same as that of the comparative example of FIG. 12 (A), but a width of a lower surface of the light blocking pattern of FIG. 12 (C) is narrow, so that the angle of the light traveling to the side surface in FIG. 12 (C) may be somewhat larger than that in FIG. 12 (A), and an angle for cutting off light is reduced. However, a difference of the angle between the comparative example of FIG. 12 (A) and the embodiment of FIG. 12 (B) may not be large, and because a height of the light blocking pattern is increased to secure the viewing angle, a difference of the viewing angle may not be large.

In contrast, in terms of the transmittance T, the embodiment of FIG. 12 (B) may be the highest. In order to describe this in detail, an actual light blocking pattern is formed as shown in FIGS. 13 and 14, and an actual measurement transmittance thereof is provided.

In FIGS. 13 and 14, a trapezoid indicates the embodiment of FIG. 12 (B), and an inverted trapezoid indicates the comparative example of FIG. 12 (C). In addition, in FIG. 14, a thickness that corresponds to a height, a width, and an interval of the light blocking pattern formed in each example are specified, a transmittance at a cut-off angle is expressed in %, and a theoretical transmittance and the actual measurement transmittance are also shown.

Based on FIGS. 12 and 13, the transmittance is roughly described using a traveling direction of light as follows.

In the comparative example of FIG. 12 (A), light reflected from the light blocking pattern travels to the side surface so that a frontal transmittance is not high, and as shown by a thick arrow in FIG. 12 (C) and an arrow in the inverted trapezoid shape of FIG. 13, light reflected from the light blocking pattern travels to the side surface so that a frontal transmittance is relatively low. In contrast, as shown by a thick arrow in FIG. 12 (B) and an arrow in the trapezoid of FIG. 13, light reflected from a side surface of the light blocking pattern may travel to a front surface so that a front transmittance is relatively high.

Referring to FIG. 14, the theoretical transmittance and the actual measurement transmittance are compared and provided, and the theoretical transmittance is a ratio of a region through which light is transmitted based on a lower surface of the light blocking pattern that is a ratio of a region where the light blocking pattern is not formed to an entire region.

In the embodiment shown in FIG. 12 (B), the theoretical transmittance may be only 64%, but the actual measurement transmittance may be 86%. In contrast, the comparative example shown in FIG. 12 (C) may have a high theoretical transmittance of 87%, but may have the actual measurement transmittance of 67% %.

In FIG. 14, the transmittance at the cut-off angle is provided. The embodiment of FIG. 12 (B) may have a lower transmittance at the cut-off angle compared with the comparative example of FIG. 12 (C) so that a blocking characteristic is also relatively high.

As described above, it may be confirmed that the light blocking pattern BL including the trapezoidal cross-section (that is, a portion having a width decreasing toward an upper portion thereof) has an improved characteristic in the transmittance and the blocking characteristic.

Figure 15:
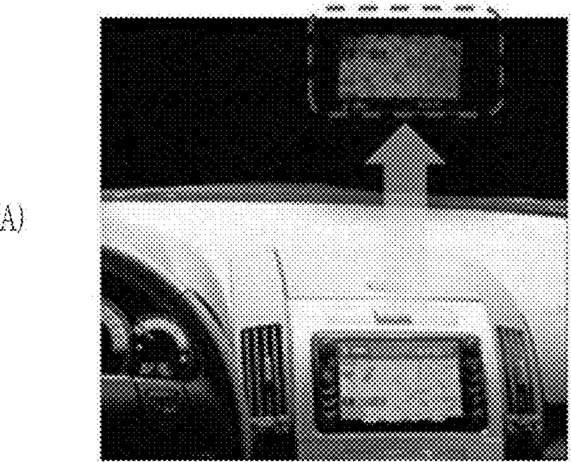
FIG. 15 is a view showing a case where a light emitting display device according to a comparative example is applied to a car.
Figure 15:
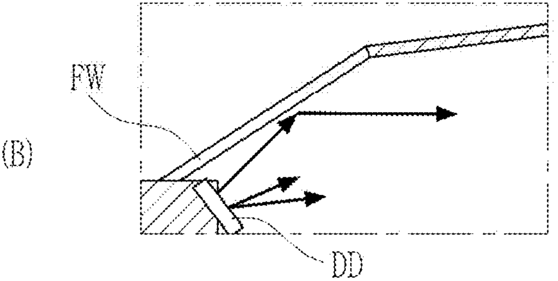
Figure 16:
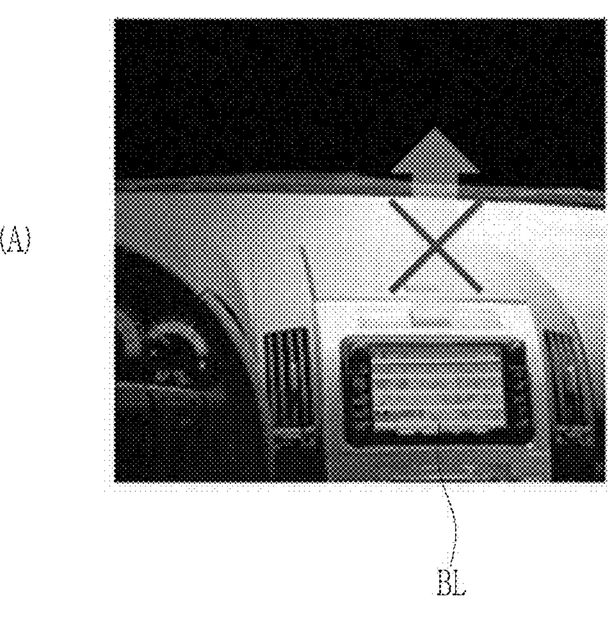
FIG. 16 is a view showing a case where the light emitting display device according to the embodiment is applied to a car.
Figure 16:
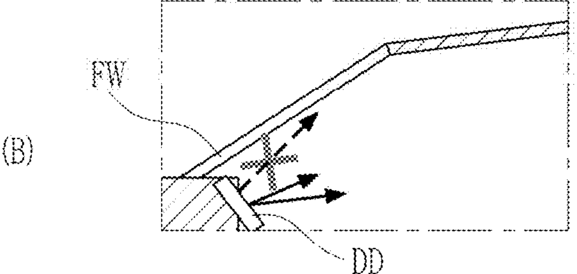

An effect that is obtained when the light emitting display device having the structure of the light blocking pattern BL described above and including the light blocking pattern BL formed through the manufacturing method is applied to a car is compared with that of the comparative example of FIG. 15 and is described through FIG. 16.

FIG. 15 is a view showing a case where a light emitting display device according to the comparative example is applied to a car, and FIG. 16 is a view showing a case where the light emitting display device according to the embodiment is applied to the car.

In the comparative example of FIG. 15, the light emitting display device DD used in the car does not include the light blocking pattern BL so that as shown in FIG. 15 (B), an angle of emitted light is not limited and is emitted in various directions.

In contrast, in the embodiment of FIG. 16, the light emitting display device DD used in the car includes a plurality of light blocking patterns BL disposed in one direction (a horizontal direction) to partially block light emitted in a vertical direction. In this case, light of 30 degrees or more based on a normal line perpendicular to a front surface of the light emitting display device DD may be blocked.

Referring to FIG. 15, light emitted from the light emitting display device DD disposed at a center fascia of the car may also be provided to a windshield FW of the car, and at night, the light emitted from the light emitting display device DD and reflected from the windshield FW may be incident on the eyes of a driver of the car so that there may be a problem obstructing the driver's view.

In contrast, referring to FIG. 16, the light emitting display device DD used in the car has the plurality of light blocking patterns BL so that the light emitted from the light emitting display device DD is incident on the windshield FW of the car. Thus, the light emitted from the light emitting display device DD is prevented from being reflected from the windshield FW even at night so as not to interfere with the view of the driver of the car.

On the other hand, the light emitting display device DD used in the car and disposition directions of the plurality of light blocking patterns BL used in the car may vary depending on an embodiment, and one embodiment of them will be described through FIG. 17.

Figure 17:
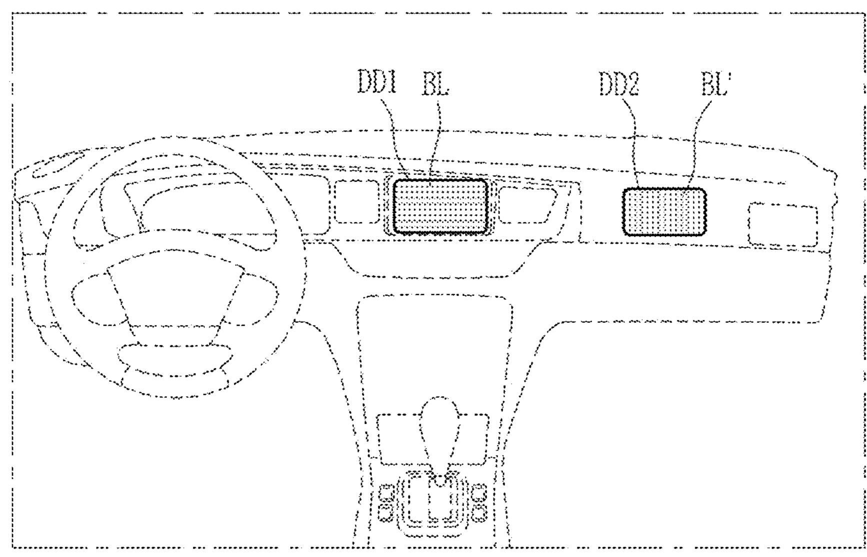
FIG. 17 is a view showing a case where the light emitting display device according to the other embodiment is applied to a car.

FIG. 17 is a view showing a case where the light emitting display device according to the other embodiment is applied to a car.

Two light emitting display devices DD1 and DD2 are attached to the car according to the embodiment of FIG. 17.

As shown in FIG. 16, the first light emitting display device DD1 is disposed at a center fascia of the car, and includes a plurality of light blocking patterns BL extending in a horizontal direction. As a result, light is not reflected at the windshield of the car so as not to obstruct the view of the driver of the car.

On the other hand, the second light emitting display device DD2 is disposed in front of a passenger seat of the car, and includes a plurality of light blocking patterns BL' extending in a vertical direction. Light emitted from the second light emitting display device DD2 may not be provided in left and right directions due to the plurality of light blocking patterns BL' disposed in the vertical direction, so that only a person sitting in the passenger seat may see a screen of the second light emitting display device DD2 and the driver may not see the screen of the second light emitting display device DD2. As a result, there is an advantage in that the driver may concentrate on driving of the car without disturbed by the second light emitting display device DD2.

In the above description, the light blocking pattern BL, the structure around the light blocking pattern BL, and the manufacturing method of the light blocking pattern BL have been described in detail along with the schematic structure of the light emitting display device.

Hereinafter, a structure of a light emitting diode or the like disposed at a lower portion of the light blocking pattern BL will be described in more detail through FIGS. 18 and 19.

Figure 18:
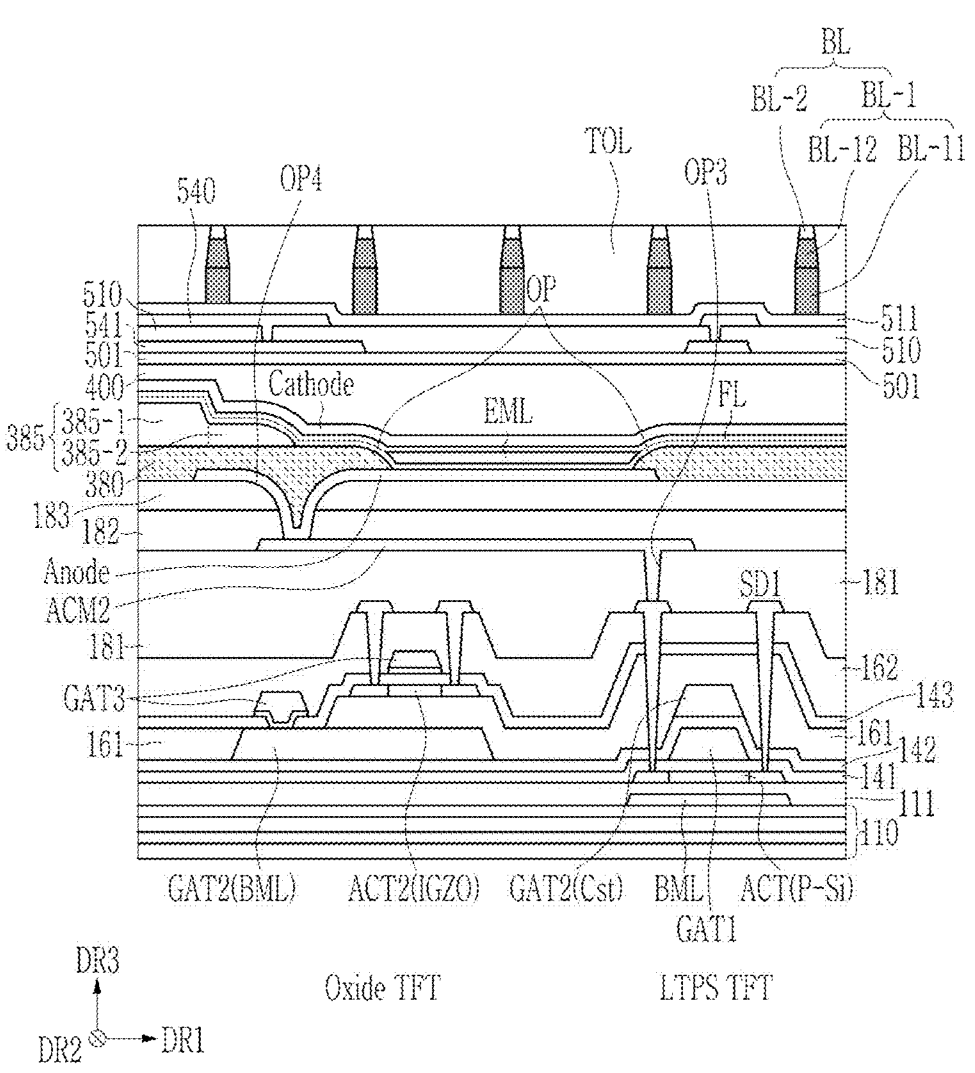
FIGS. 18 and 19 are views illustrating a cross-sectional structure of the light emitting display device according to each embodiment.
Figure 19:
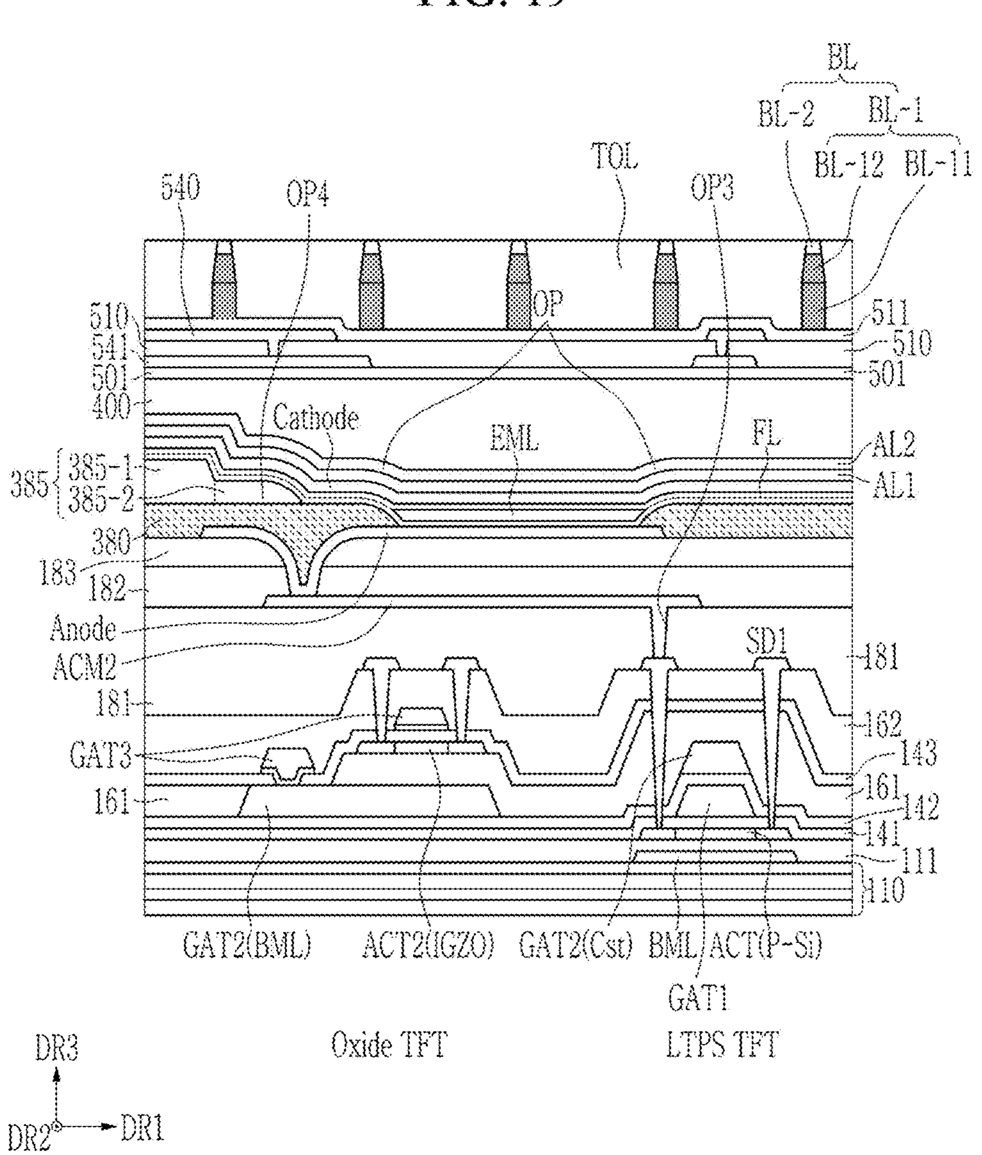

FIGS. 18 and 19 are views illustrating a cross-sectional structure of the light emitting display device according to each embodiment.

First, FIG. 18 illustrates a stacked structure of a pixel disposed at a display region of the light emitting display device.

The light emitting display device may include a lower panel layer and an upper panel layer, and the lower panel layer may be a portion where the light emitting diode and a pixel circuit portion included in the pixel are disposed, and may include up to the encapsulation layer 400 covering the lower panel layer. Here, the pixel circuit portion may include a second organic film 182 and a third organic film 183, and may mean a configuration disposed at a lower portion of the second organic film 182, and the light emitting diode may be disposed at an upper portion of the third organic film 183, and may mean a configuration disposed at a lower portion of the encapsulation layer 400. A structure disposed at an upper portion of the encapsulation layer 400 may correspond to the upper panel layer, and the plurality of light blocking patterns BL are included in the upper panel layer. According to an embodiment, the third organic film 183 may not be included.

Referring to FIG. 18, a metal layer BML is disposed on a substrate 110.

The substrate 110 may include a rigid material such as glass or the like that does not bend, or may include a flexible material such as plastic or polyimide that may bend. As shown in FIG. 18, the flexible substrate may have a structure in which a double-layered structure including polyimide and a barrier layer formed of an inorganic insulating material on the polyimide is doubly formed.

The metal layer BML may be formed at a position overlapping a channel of a driving transistor of a subsequent first semiconductor layer ACT (P—Si) in a plan view, and is also referred to as a lower shielding layer. The metal layer BML may include a metal such as copper (Cu), molybdenum (Mo), aluminum (Al), titanium (Ti), or the like, or a metal alloy. Here, the driving transistor may refer to a transistor that generates an electric current transferred to the light emitting diode.

A buffer layer 111 covering the substrate 110 and the metal layer BML is disposed on the substrate 110 and the metal layer BML. The buffer layer 111 serves to block penetration of an impurity element into the first semiconductor layer ACT (P—Si), and may be an inorganic insulating film including silicon oxide ($SiO_x$), silicon nitride ($SiN_x$), silicon oxynitride ($SiO_xN_y$), or the like.

The first semiconductor layer ACT (P—Si) formed of a silicon semiconductor (e.g., a polycrystalline semiconductor (P—Si)) is disposed on the buffer layer 111. The first semiconductor layer ACT (P—Si) includes a channel of a polycrystalline transistor LTPS TFT including the driving transistor and first and second regions disposed on both sides of the channel. Here, the polycrystalline transistor LTPS TFT may include various switching transistors as well as the driving transistor. In addition, the polycrystalline transistor LTPS TFT may include regions having a conductive layer characteristic by plasma treatment or doping on both sides of each channel that serve as the first and second electrodes of the transistor.

A first gate insulating film 141 may be disposed on the first semiconductor layer ACT (P—Si). The first gate insulating film 141 may be an inorganic insulating film including silicon oxide ($SiO_x$), silicon nitride ($SiN_x$), silicon oxynitride ($SiON_y$), or the like.

A first gate conductive layer including a gate electrode GAT1 of the polycrystalline transistor LTPS TFT may be disposed on the first gate insulating film 141. In addition to the gate electrode GAT1 of the polycrystalline transistor LTPS TFT, a scan line or a light emitting control line may be formed in the first gate conductive layer. The first gate conductive layer may include a metal such as copper (Cu), molybdenum (Mo), aluminum (Al), titanium (Ti), or the like, or a metal alloy, and may include a single layer or multiple layers.

After the first gate conductive layer is formed, the plasma treatment or doping process may be performed on the formed first gate conductive layer to make an exposed region of the first semiconductor layer conductive. That is, the first semiconductor layer ACT (P—Si) covered by the first gate conductive layer may not be conductive, and the portion of the first semiconductor layer ACT (P—Si) not covered by the first gate conductive layer may have the same characteristic as that of the conductive layer.

A second gate insulating film 142 may be disposed on the first gate conductive layer and the first gate insulating film 141. The second gate insulating film 142 may be an inorganic insulating film including silicon oxide ($SiO_x$), silicon nitride ($SiN_x$), silicon oxynitride ($SiO_xN_y$), or the like.

A second gate conductive layer GAT2 including one electrode GAT2 (Cst) of a storage capacitor Cst and a lower shielding layer GAT2 (BML) of an oxide transistor Oxide TFT may be disposed on the second gate insulating film 142. The lower shielding layer GAT2 (BML) of the oxide transistor Oxide TFT may be disposed at a lower portion of a channel of the oxide transistor Oxide TFT to serve to shield from light, electromagnetic interference, or the like provided to the channel from a lower side. On the other hand, the one electrode GAT2 (Cst) of the storage capacitor Cst overlaps the gate electrode GAT1 of the driving transistor to form the storage capacitor Cst. According to an embodiment, the second gate conductive layer GAT2 may further include a scan line, a control line, or a voltage line. The second gate conductive layer GAT2 may include a metal such as copper (Cu), molybdenum (Mo), aluminum (Al), titanium (Ti), or the like, or a metal alloy, and may include a single layer or multiple layers.

A first interlayer insulating film 161 may be disposed on the second gate conductive layer GAT2. The first interlayer insulating film 161 may include an inorganic insulating film (or an inorganic insulating material) including silicon oxide ($SiO_x$), silicon nitride ($SiN_x$), silicon oxynitride ($SiO_xN_y$), or the like, and in an embodiment, the inorganic insulating film may be thickly formed.

An oxide semiconductor layer (hereinafter also referred to as a second semiconductor layer) ACT2 (IGZO) including the channel, a first region, and a second region of the oxide transistor Oxide TFT may be disposed on the first interlayer insulating film 161.

A third gate insulating film 143 may be disposed on the oxide semiconductor layer ACT2 (IGZO). The third gate insulating film 143 may be disposed on entire surfaces of the oxide semiconductor layer ACT2 (IGZO) and the first interlayer insulating film 161. The third gate insulating film 143 may include an inorganic insulating film (or an inorganic insulating material) including silicon oxide ($SiO_x$), silicon nitride ($SiN_x$), silicon oxynitride ($SiO_xN_y$), or the like.

A third gate conductive layer including a gate electrode GAT3 of the oxide transistor Oxide TFT may be disposed above or on the third gate insulating film 143. The gate electrode GAT3 of the oxide transistor Oxide TFT may overlap the channel of the oxide transistor. The third gate conductive layer may further include a scan line or a control line. The third gate conductive layer may include a metal such as copper (Cu), molybdenum (Mo), aluminum (Al), titanium (Ti), or the like, or a metal alloy, and may include a single layer or multiple layers.

A second interlayer insulating film 162 may be disposed on the third gate conductive layer. The second interlayer insulating film 162 may have a single-layer or multi-layer structure. The second interlayer insulating film 162 may include an inorganic insulating material such as silicon nitride ($SiO_x$), silicon nitride ($SiN_x$), silicon oxynitride ($SiO_xN_y$), or the like, and may include an organic material according to an embodiment.

A first data conductive layer SD1 including a connection electrode that may be connected to the first and second regions of each of the polycrystalline transistor LTPS TFT and the oxide transistor Oxide TFT may be disposed on the second interlayer insulating film 162. The first data conductive layer SD1 may include a metal such as aluminum (Al), copper (Cu), molybdenum (Mo), titanium (Ti), or the like, or a metal alloy, and may include a single layer or multiple layers.

A first organic film 181 may be disposed on the first data conductive layer SD1. The first organic film 181 may be an organic insulating film including an organic material, and the organic material may include at least one material selected from the group consisting of polyimide, polyamide, acrylic resin, benzocyclobutene, and phenol resin.

A second data conductive layer including an anode connection electrode ACM2 may be disposed on the first organic film 181. The second data conductive layer may also include a data line or a driving voltage line. The second data conductive layer may include a metal such as aluminum (Al), copper (Cu), molybdenum (Mo), titanium (Ti), or the like, or a metal alloy, and may include a single layer or multiple layers. The anode connection electrode ACM2 is connected to the first data conductive layer SD1 through an opening OP3 disposed in the first organic film 181.

The second organic film 182 and the third organic film 183 are disposed on the second data conductive layer, and an opening OP4 for anode connection is formed at the second organic film 182 and the third organic film 183. The anode connection electrode ACM2 is electrically connected to an anode Anode through the opening OP4 for anode connection. Each of the second organic film 182 and the third organic film 183 may be an organic insulating film including an organic material, and the organic material may include at least one material selected from the group consisting of polyimide, polyamide, acrylic resin, benzocyclobutene, and phenol resin. According to an embodiment, the third organic film 183 may be omitted.

The pixel defining film 380 that covers at least a portion of the anode while having an opening OP exposing the anode may be disposed on the anode. The pixel defining film 380 may be a black pixel defining film formed of an organic material having a black color so that light applied from the outside is not reflected back to the outside, and may be formed of a transparent organic material in an embodiment. Therefore, according to an embodiment, the pixel defining film 380 may include a negative type black color organic material, or may include a black color pigment.

A spacer 385 may be disposed on the pixel defining film 380. Unlike the pixel defining film 380, the spacer 385 may be formed of a transparent organic insulating material. According to an embodiment, the spacer 385 may be formed of a transparent organic material of a positive type. The spacer 385 may include two portions 385-1 and 385-2 with different heights, the portion 385-1 with greater height may serve as a spacer, and the portion 385-2 with less height may improve an adhesion characteristic between the spacer and the pixel defining film 380.

A functional layer FL and a cathode Cathode may be sequentially formed above or on the anode, the spacer 385, and the pixel defining film 380, and the functional layer FL and the cathode may be disposed at an entire region. A light emitting layer EML may be disposed between functional layers FL, and the light emitting layer EML may be disposed only within the opening OP of the pixel defining film 380. Hereinafter, the functional layer FL and the light emitting layer EML may be referred to as an intermediate layer. The functional layer FL may include at least one of auxiliary layers such as an electron injection layer, an electron transfer layer, a hole transfer layer, and a hole injection layer, the hole injection layer and the hole transfer layer may be disposed at a lower portion of the light emitting layer EML, and the electron transfer layer and the electron injection layer may be disposed at an upper portion of the light emitting layer EML.

The encapsulation layer 400 is disposed on the cathode. The encapsulation layer 400 may include at least one inorganic film and at least one organic film, and may have a triple layer structure including a first inorganic encapsulation layer, an organic encapsulation layer, and a second inorganic encapsulation layer shown in the embodiment of FIGS. 4A, 4B and 4C. The encapsulation layer 400 may protect the light emitting layer EML from moisture, oxygen, or the like that may be introduced from the outside. According to an embodiment, the encapsulation layer 400 may include a structure in which an inorganic layer and an organic layer are sequentially further stacked.

According to an embodiment, sensing insulating layers 501, 510, and 511 and a plurality of sensing electrodes 540 and 541 for touch sensing may be disposed above or on the encapsulation layer 400. In the embodiment of FIG. 18, a touch may be sensed in a capacitive type using two sensing electrodes 540 and 541.

Specifically, the first sensing insulating layer 501 is formed on the encapsulation layer 400, and the plurality of sensing electrodes 540 and 541 are formed above or on the first sensing insulating layer 501. The plurality of sensing electrodes 540 and 541 may be insulated from each other with the second sensing insulating layer 510 interposed therebetween, and some of the plurality of sensing electrodes 540 and 541 may be electrically connected through an opening disposed in the sensing insulating layer 510. Here, each of the sensing electrodes 540 and 541 may include a metal such as aluminum (Al), copper (Cu), silver (Ag), gold (Au), molybdenum (Mo), titanium (Ti), tantalum (Ta), or the like, or a metal alloy, and may include a single layer or multiple layers. The third sensing insulating layer 511 is formed on the sensing electrode 540.

The plurality of light blocking patterns BL is formed on the third sensing insulating layer 511. That is, the upper transparent organic film TOL and the plurality of light blocking patterns BL are disposed on the third sensing insulating layer 511. Various modified embodiments described in FIGS. 1 to 17 may also be applied to the upper transparent organic film TOL and the light blocking patterns BL disposed on the third sensing insulating layer 511.

A separate light blocking layer, color filter, and/or color conversion layer may not be formed due to the plurality of light blocking patterns BL. However, according to an embodiment, the separate light blocking layer, color filter, and/or color conversion layer may be additionally formed at an upper portion or a lower portion of the plurality of light blocking patterns BL.

In addition, according to an embodiment, a polarizing plate may be included at an upper portion of the plurality of light blocking patterns BL. However, the polarizing plate may not be used in an embodiment in which the pixel defining film 380 is formed to include black pigment.

The plurality of light blocking patterns BL and the upper transparent organic film TOL may be covered with an additional organic film (also referred to as a planarization film) to flatten the front surface of the light emitting display device.

In FIG. 18, an embodiment in which a total of three organic films are formed and the opening for anode connection is formed in the second organic film and the third organic film has been described. However, at least two organic films may be formed, and in this case, the opening for anode connection may be disposed at an upper organic film disposed away from the substrate, and an opening of a lower organic film may be disposed at the lower organic film.

On the other hand, the embodiment of FIG. 18 may also include various modified embodiments, and one of them will be described through FIG. 19.

In the embodiment of FIG. 19, a material included in the upper transparent organic film TOL is formed to selectively absorb light of a wavelength of some band among light reflected inside the display device or light incident from the outside of the display device. The material (hereinafter referred to as a reflection adjustment material) included in the upper transparent organic film TOL and capable of absorbing light of a certain wavelength may have the following characteristic.

The reflection adjustment material may absorb a first wavelength region of 490 nm to 505 nm and a second wavelength region of 585 nm to 600 nm so that a light transmittance in the first wavelength region and the second wavelength region is less than or equal to 40%. The reflection adjustment material may absorb light with a wavelength outside a light emitting wavelength range of red, green, or blue emitted by the light emitting diode. As described above, the reflection adjustment material may absorb light with the wavelength that does not belong to the wavelength range of red, green, or blue emitted from the light emitting diode so that a decrease in luminance of the display device is prevented or minimized, a decrease in luminous efficiency of the display device is simultaneously prevented or minimized, and visibility is improved.

In an embodiment, the reflection adjustment material may include an organic material layer including a dye, a pigment, or a combination thereof. The reflection adjustment material may include a tetra aza porphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, or a combination thereof.

In an embodiment, a reflectance measured in a specular component included (SCI) mode at a surface of the reflection adjustment material may be less than or equal to 10%. That is, the visibility may be improved by absorbing reflection of external light of the display device by the reflection adjustment material.

In an embodiment, the reflection adjustment material may have a transmittance of about 64% to 72%. The transmittance of the reflection adjustment material may be adjusted according to the content of a pigment and/or a dye included in the reflection adjustment material.

In an embodiment including the reflection adjustment material, a capping layer AL1 and a low reflection layer AL2 may be additionally formed between the cathode and the encapsulation layer 400.

The capping layer AL1 may play a role of improving light emitting efficiency of the light emitting diode by a principle of constructive interference. For example, the capping layer AL1 may include a material having a refractive index of 1.6 or more for light having a wavelength of 589 nm.

The capping layer AL1 may be an organic capping layer including an organic material, an inorganic capping layer including an inorganic material, or a composite capping layer including an organic material and an inorganic material. For example, the capping layer AL1 may include a carbocyclic compound, a heterocyclic compound, an amine group-containing compound, a porphine derivative, a phthalocyanine derivative, a naphthalocyanine derivative, an alkali metal complex, an alkali earth metal complex, or a combination thereof. The carbocyclic compound, the heterocyclic compound, and the amine group-containing compound may be optionally substituted with a substituent including O, N, S, Se, Si, F, Cl, Br, I, or any combination thereof.

The low reflection layer AL2 may be disposed on the capping layer AL1. The low reflection layer AL2 may overlap an entire surface of the substrate 110.

The low reflection layer AL2 may include an inorganic material having a low reflectance, and may include a metal or a metal oxide in an embodiment. If the low reflection layer AL2 includes the metal, the metal may, for example, include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof. In addition, if the low reflection layer AL2 includes the metal oxide, the metal oxide may, for example, include one constituent compound such $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, SiNx, LiF, $CaF_2$, $MgF_2$, CdS, or a combination thereof.

In an embodiment, an absorption coefficient (k) of the inorganic material included in the low reflection layer AL2 may be equal to or less than 4.0 and greater than 0.5 ($0.5<k\leq 4.0$). In addition, the inorganic material included in the low reflection layer AL2 may have a refractive index (n) of 1 or more ($n\geq 1.0$).

The low reflection layer AL2 may induce destructive interference between light incident to the inside of the display device and light reflected from a metal disposed at a lower portion of the low reflection layer AL2 so that external light reflectance is reduced. Therefore, display quality and visibility of the display device may be improved by reducing the external light reflectance of the display device through the low reflection layer AL2.

According to an embodiment, the capping layer AL1 may be omitted so that the low reflection layer AL2 contacts the cathode.

The encapsulation layer 400 is disposed on the low reflection layer AL2, and 5 other structures of FIG. 19 are the same as those of FIG. 18 so that a description thereof is omitted.

The plurality of light blocking patterns BL according to the embodiments of FIGS. 18 and 19 may have a structure corresponding to that of FIGS. 4A, 4B and 4C, but may have the same structure as those of FIGS. 9 to 11 in an embodiment.

While this disclosure has been described in connection with what is presently considered to be practical embodiments, it should be understood that the disclosure is not limited to the disclosed embodiments, but, on the contrary, is intended to cover various modifications and equivalent arrangements included within the spirit and scope of the appended claims.

What is claimed is:

1. A light emitting display device, comprising:
- a substrate;
- a plurality of light emitting diodes that are disposed above the substrate and include a plurality of light emitting layers;
- a pixel defining layer that has openings corresponding to the plurality of light emitting layers; and
- a plurality of light blocking patterns that are disposed on the pixel defining layer and the plurality of light emitting layers, and extend in a first direction,
- wherein each of the plurality of light blocking patterns includes a first portion and a second portion formed on the first portion and having a width decreasing toward an upper portion thereof.

2. The light emitting display device of claim 1, wherein the first portion and the second portion have different etching rates and the etching rate of the first portion is lower than that of the second portion.

3. The light emitting display device of claim 2, further comprising a third portion disposed on the second portion,
- wherein the third portion has a width decreasing toward an upper portion thereof.

4. The light emitting display device of claim 3, wherein a slope of a side surface of the third portion is different from a slope of a side surface of the second portion.

5. The light emitting display device of claim 3, wherein the third portion includes a transparent organic material.

6. The light emitting display device of claim 5, wherein the third portion includes at least one of amorphous carbon, silicon oxide ($SiO_x$), silicon nitride ($SiN_x$), silicon oxynitride (SiON), indium zinc oxide (IZO), indium tin oxide (ITO), and indium gallium zinc oxide (IGZO).

7. The light emitting display device of claim 5, wherein a lower surface of the third portion and an upper surface of the second portion have the same width, or the lower surface of the third portion has a narrower width than that of the upper surface of the second portion.

8. The light emitting display device of claim 2, wherein the first portion and the second portion has a width that decreases toward an upper portion of the second portion as a whole.

9. The light emitting display device of claim 2, wherein the first portion and the second portion include a light blocking material, and the light blocking material includes at least one of an organic material including a black color pigment, carbon black, carbon nanotube, a resin or a paste including a black dye, a metal particle, a metal alloy, and a metal oxide.

10. The light emitting display device of claim 2, further comprising an upper transparent organic film disposed between the plurality of light blocking patterns disposed adjacent to each other.

11. The light emitting display device of claim 2, wherein at least one of the plurality of light blocking patterns crosses and overlaps at least one of the plurality of light emitting layers.

12. The light emitting display device of claim 2, wherein each of the plurality of light emitting diodes has a viewing angle so that light emitted from the each of the plurality of light emitting diodes is not emitted at an angle greater than or equal to the viewing angle with respect to a normal line, and the viewing angle is greater than or equal to 30 degrees and less than or equal to 45 degrees.

13. A car comprising a first light emitting display device, the first light emitting display device including:
- a first substrate;
- a plurality of first light emitting diodes that are disposed above the first substrate and include a plurality of first light emitting layers;
- a first pixel defining layer that has first openings corresponding to the plurality of first light emitting layers; and
- a plurality of first light blocking patterns that are disposed on the first pixel defining layer and the plurality of first light emitting layers, and extend in a first direction,
- wherein each of the plurality of first light blocking patterns includes a first portion and a second portion formed on the first portion and having a width decreasing toward an upper portion thereof.

14. The car of claim 13, further comprising a second light emitting display device, the second light emitting display device including:
- a second substrate;
- a plurality of second light emitting diodes that are disposed above the second substrate and include a plurality of second light emitting layers;
- a second pixel defining layer that has second openings corresponding to the plurality of second light emitting layers; and
- a plurality of second light blocking patterns that are disposed on the second pixel defining layer and the plurality of second light emitting layers, and extend in a second direction different from the first direction,
- wherein each of the plurality of second light blocking patterns includes a first portion and a second portion formed on the first portion and having a width decreasing toward an upper portion thereof.

15. The car of claim 14, wherein the first portion and the second portion of the plurality of second light blocking patterns have different etching rates, and the etching rate of the first portion is lower than that of the second portion.

16. The car of claim 13, wherein the first portion and the second portion of the plurality of first light blocking patterns have different etching rates, and the etching rate of the first portion is lower than that of the second portion.

17. The car of claim 16, wherein the first portion has a pillar shape with a certain width and
- the second portion has a width decreasing toward an upper portion thereof.

18. The car of claim 16, wherein the first portion and the second portion has a width that decreases toward an upper portion of the second portion as a whole.

19. The car of claim 16, further comprising an upper transparent organic film disposed between the plurality of first light blocking patterns disposed adjacent to each other.

20. The car of claim 16, wherein at least one of the plurality of first light blocking patterns crosses and overlaps the light emitting layer.

* * * * *